(12) United States Patent
Hiew et al.

(10) Patent No.: US 7,517,231 B2
(45) Date of Patent: Apr. 14, 2009

(54) SOLID STATE DRIVE (SSD) WITH OPEN TOP AND BOTTOM COVERS

(75) Inventors: Siew S. Hiew, San Jose, CA (US); Jim Chin-Nan Ni, San Jose, CA (US); Abraham C. Ma, Fremont, CA (US); Qijin Li, Irvine, CA (US); Nan Nan, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/929,917

(22) Filed: Oct. 30, 2007

(65) Prior Publication Data

US 2008/0089020 A1 Apr. 17, 2008

Related U.S. Application Data

(63) Continuation-in-part of application No. 11/683,292, filed on Mar. 7, 2007, and a continuation-in-part of application No. 11/309,843, filed on Oct. 11, 2006, and a continuation-in-part of application No. 10/990,887, filed on Nov. 16, 2004, now Pat. No. 7,301,776.

(51) Int. Cl.
*H01R 12/00* (2006.01)
(52) U.S. Cl. ..................................... 439/76.1
(58) Field of Classification Search ............... 439/76.1, 439/906; 361/684, 737, 732.752; 257/679
See application file for complete search history.

(56) References Cited

U.S. PATENT DOCUMENTS

| 5,206,792 | A |   | 4/1993  | Reynolds |
|-----------|---|---|---------|----------|
| 5,330,360 | A |   | 7/1994  | Marsh et al. |
| 5,413,490 | A | * | 5/1995  | Tan et al. .................. 439/76.1 |
| 5,476,387 | A | * | 12/1995 | Ramey et al. ............. 439/76.1 |
| 5,477,426 | A | * | 12/1995 | Bethurum ................... 361/737 |
| 5,488,523 | A |   | 1/1996  | Seaver et al. |
| 5,563,769 | A |   | 10/1996 | MacGregor |
| 5,768,110 | A | * | 6/1998  | Frommer et al. ............ 361/755 |
| 6,256,878 | B1 |   | 7/2001 | Keane |
| 6,320,252 | B1 | * | 11/2001 | Potters et al. ............... 257/679 |
| 6,430,000 | B1 |   | 8/2002 | Rent |
| 6,493,233 | B1 |   | 12/2002 | De Lorenzo et al. |
| 6,519,110 | B2 | * | 2/2003  | Dague et al. ............. 360/97.01 |
| 6,890,189 | B1 |   | 5/2005 | Wu |
| 6,908,339 | B2 | * | 6/2005  | Tanaka ....................... 439/607 |

(Continued)

*Primary Examiner*—Alexander Gilman
(74) *Attorney, Agent, or Firm*—Bever, Hoffman & Harms, LLP; Patrick T. Bever

(57) ABSTRACT

A solid state drive (SSD) device includes a printed-circuit board assembly (PCBA), a connector mounted on the circuit board, an open-frame support-type housing including first and second parallel elongated brackets extending along opposing peripheral edges of said circuit board, each bracket including a first connecting structure for securing the circuit board to the housing, and a second connecting structure for connecting the housing to an internal rack frame of a host system. The open-frame support type housing does not include a top cover and a bottom cover, whereby both of said opposing first and second surfaces are exposed by first and second openings. The housing includes optional end rails that form a box-like frame. The elongated brackets are formed using die-cast metal, stamped metal, or molded plastic with copper posts. Optional clamp-type brackets clamp along side edges of the PCBA.

2 Claims, 18 Drawing Sheets

U.S. PATENT DOCUMENTS

| | | |
|---|---|---|
| 7,008,240 B1 | 3/2006 | Wang et al. |
| 7,019,980 B2 | 3/2006 | Gu |
| 7,034,223 B2 | 4/2006 | Fan et al. |
| 7,113,392 B2 | 9/2006 | Lu et al. |
| 2002/0097556 A1 | 7/2002 | Lee |
| 2005/0164532 A1 | 7/2005 | Ni et al. |
| 2006/0041783 A1 | 2/2006 | Rabinovitz |
| 2006/0228910 A1 | 10/2006 | Nishizawa et al. |

\* cited by examiner

SOLID STATE DRIVE (SSD) WITH OPEN TOP AND BOTTOM COVERS

RELATED APPLICATION

This application is a continuation-in-part (CIP) of the co-pending applications for "Thin Hard Drive with 2-Piece-Casing and Ground Pin Standoff to Reduce ESD Damage to Stacked PCBA's" U.S. Ser. No. 11/683,292, filed Mar. 7, 2007, "Thin Flash-Hard-Drive with Two-Piece Casing", U.S. Ser. No. 11/309,843, filed Oct. 11, 2006, "Light-Weight Flash Hard Drive With Plastic Frame", U.S. Ser. No. 10/990,887, filed Nov. 16, 2004.

FIELD OF THE INVENTION

This present invention relates to methods for manufacturing a flash-memory solid state drive (SSD) with an Open Frame Support type package and single or double stacked printed-circuit board (PCB).

BACKGROUND OF THE INVENTION

A solid-state drive (SSD) is a memory data storage device that utilizes solid-state memory (e.g., flash-type "non-volatile" memory or synchronous dynamic access memory (SDRAM) "volatile" memory) to store persistent data. SSDs are an alternative to conventional hard disk drive that has slower memory data access times due to the mechanical moving parts. The absent of rotating disks and mechanical devices in the SSD greatly improves electro-magnetic-interference (EMI), physical shock resistance and reliability. However, SSDs may be more prone to electro-static-discharge relative to the conventional servo motor hard drive where the recording surfaces are made of magnetic material that is highly EDS resistive. Providing ground post to ground all electronic components on PBCA to bigger ground plane to allow better static charges to dissipate before it harms the weaker components on the PCBA.

As higher memory density is compacting into the ever shrinking real estate of electronic device or gadget, heat has also becomes an issue to the performance of the electronics. Better heat convection plus light weight package or housing will gain prominence and popularity due to the smaller and lighter electronic gadget trends.

What is desired is a light weight SSD device that provides electro-static-discharge (ESD) protection and improved heat dissipation characteristics.

SUMMARY OF THE INVENTION

The present invention is directed to a solid state drive (SSD) device including an open-frame type housing (i.e., not top or bottom cover) that includes first and second brackets supporting a single or double stacked printed-circuit board assembly (PCBA). The open-frame type housing of the present invention has lower cost and lighter weight advantages over prior art SSDs by omitting covers from over the surfaces of the PCBA(s), and improves ventilation to cool down the electronic components on the PCBA more efficiently, and thus improve the performance of the SSD device. Due to its light weight, the present invention is very suitable for portable devices. The appearance of the open-frame type housing is not a concern because the SSD device is typically mounted inside the chassis of the host devices such as note book, desk top and other portable electronic gadgets that require a memory drive. Further, the open-frame type housing is better suited for heat ventilation to provide a cooler environment for electronic components to operate under peak conditions. Further, removing the top and bottom covers reduces manufacturing cost due to the reduction of housing material. Moreover, the open-frame type housing facilitates faster manufacturing throughput with less screws to assemble.

According to an aspect of the invention, each of the embodiments described herein includes means for preventing ESD damage by providing a current path from the SSD PCBA to metal portions of the various open-frame support-type housings, and from each housing to the internal rack frame of a host system to which the SSD is attached. In accordance with an aspect of the present invention, the current path is established during the assembly/mounting process (i.e., connections between the PCBA and the housing are established during assembly by way of first screws or other fasteners, and between the housing and internal rack frame of the host system by way of second screws or other fasteners).

According to a first series of embodiments, each open-frame support-type housing is a die-cast metal structure including end rails that are integrally connected to said first and second brackets to form a rectangular open frame that surrounds the PCBA. Each of said first and second parallel elongated brackets and said first and second end rails comprises an L-shaped flange having a horizontal flange portion and a vertical flange portion extending perpendicular to the horizontal flange portion. The connector is attached to an end edge of the PCBA, and is disposed in an opened gap defined in one of the end rails. Support post are disposed on an inside surface of said vertical portion of the brackets, and define first screw holes that are aligned with second screw holes formed in the PCBA during assembly, and first screws are inserted through the second screw holes and into the first screw holes to secure the PCBA to the housing. Some of the screw holes have metal collars that are connected to the PCBA ground plane, whereby the act of inserting the first screws provides a current path between the housing and the PCBA to reduce the chance of ESD damage to the PCBA. Each vertical flange portion has a flat outward-facing surface that defines a third screw hole, whereby the housing is connected to the internal rack frame of the host system.

According to another series of embodiments, the first and second parallel elongated brackets comprise substantially identical separate structures, each including support structures and screw holes and for supporting and connecting to the PCBA, whereby the first and second parallel elongated brackets are connected solely by said PCBA and said first screws. The first and second brackets are die-cast metal or stamped/folded sheet metal, or plastic structures with metal inserts to provide ESD protection. In some embodiments, each of the first and second brackets includes upper and lower clamp structures that clamp onto opposing side edges of the PBA.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in SSD devices. The following description is presented to enable one of ordinary skill in the art to make and use the invention as provided in the context of a particular application and its requirements. As used herein, directional terms such as "upper", "upwards", "lower", "downward", "front", "rear", "vertical", "horizontal", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that while SSDs are more reliable than rotating hard disks, SSDs may suffer from reliability problems from electro-static-discharges (ESD). Especially as integrated circuit (IC) feature sizes continue to shrink to produce higher memory densities, the susceptibility to ESD damage increases. Thus, each of the embodiments described herein includes means for preventing ESD damage by providing a current path from the SSD PCBA housing the ICs to the various open-frame support-type housings of the present invention, and from the open-frame support-type housings to the internal rack frame of a host system to which the SSD is attached. In accordance with an aspect of the present invention, the current path is established during the assembly/mounting process (i.e., connections between the PCBA and the housing are established during assembly by way of first screws or other fasteners, and between the housing and internal rack frame of the host system by way of second screws or other fasteners).

Figure 1A:
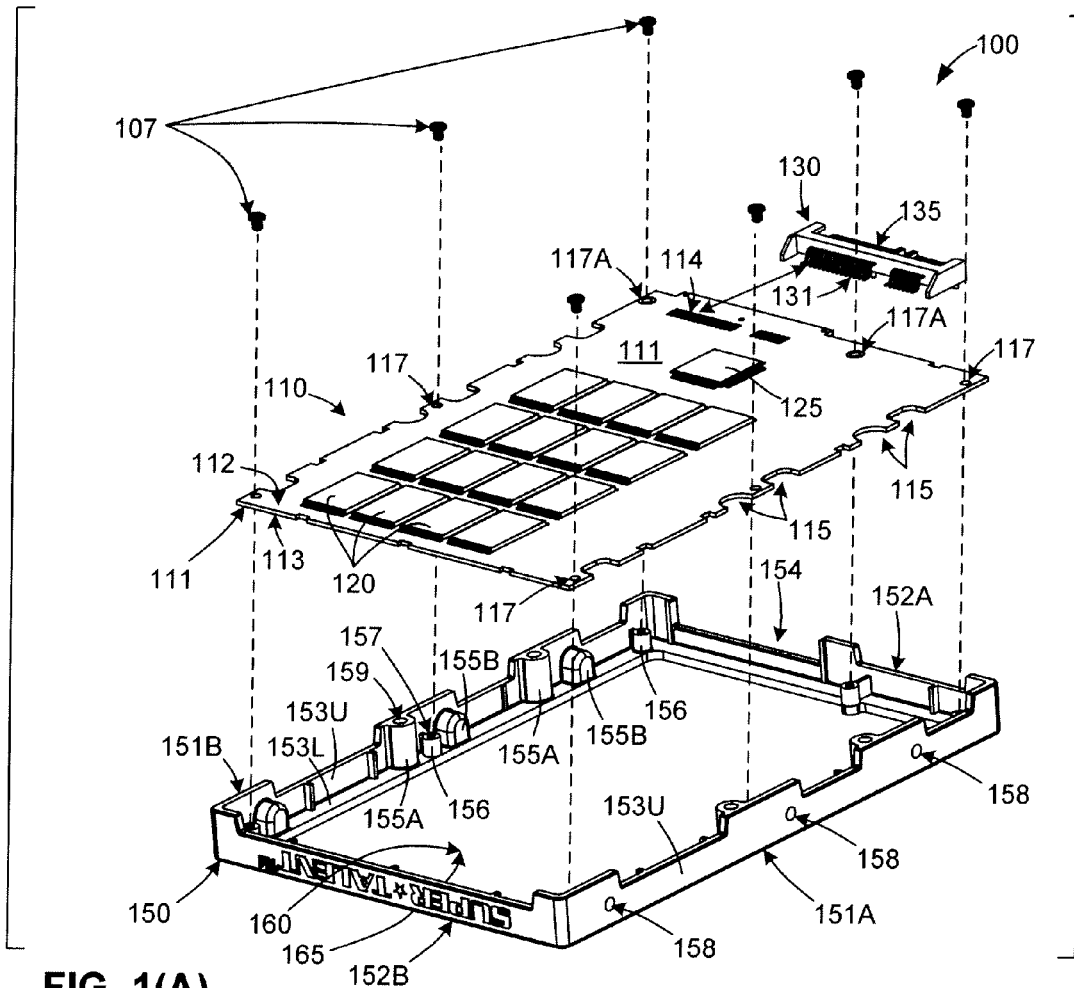
FIGS. 1(A) and 1(B) are exploded perspective and assembled perspective views showing a 3.5" SATA-type SSD device with a frame-type die-cast metal open-frame support-type housing according to an embodiment of the present invention.
Figure 1B:
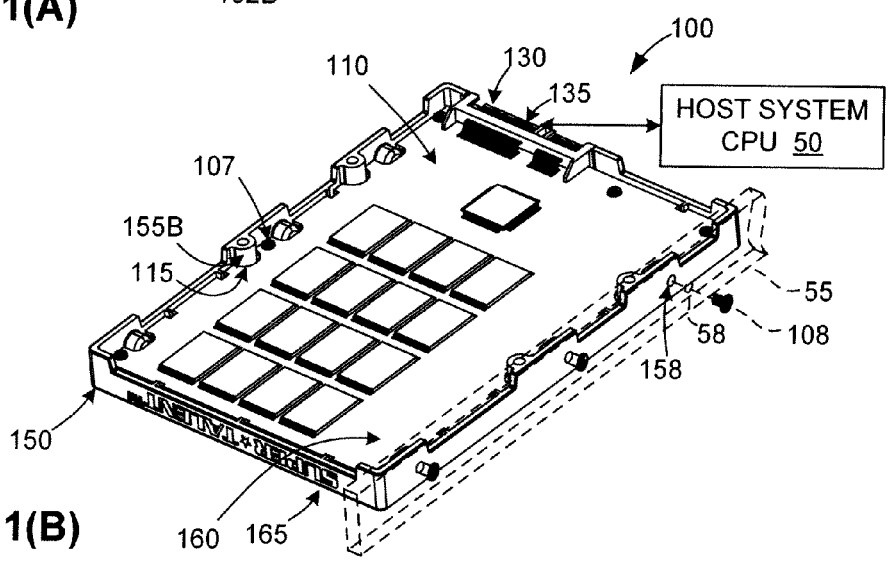
Figure 2A:
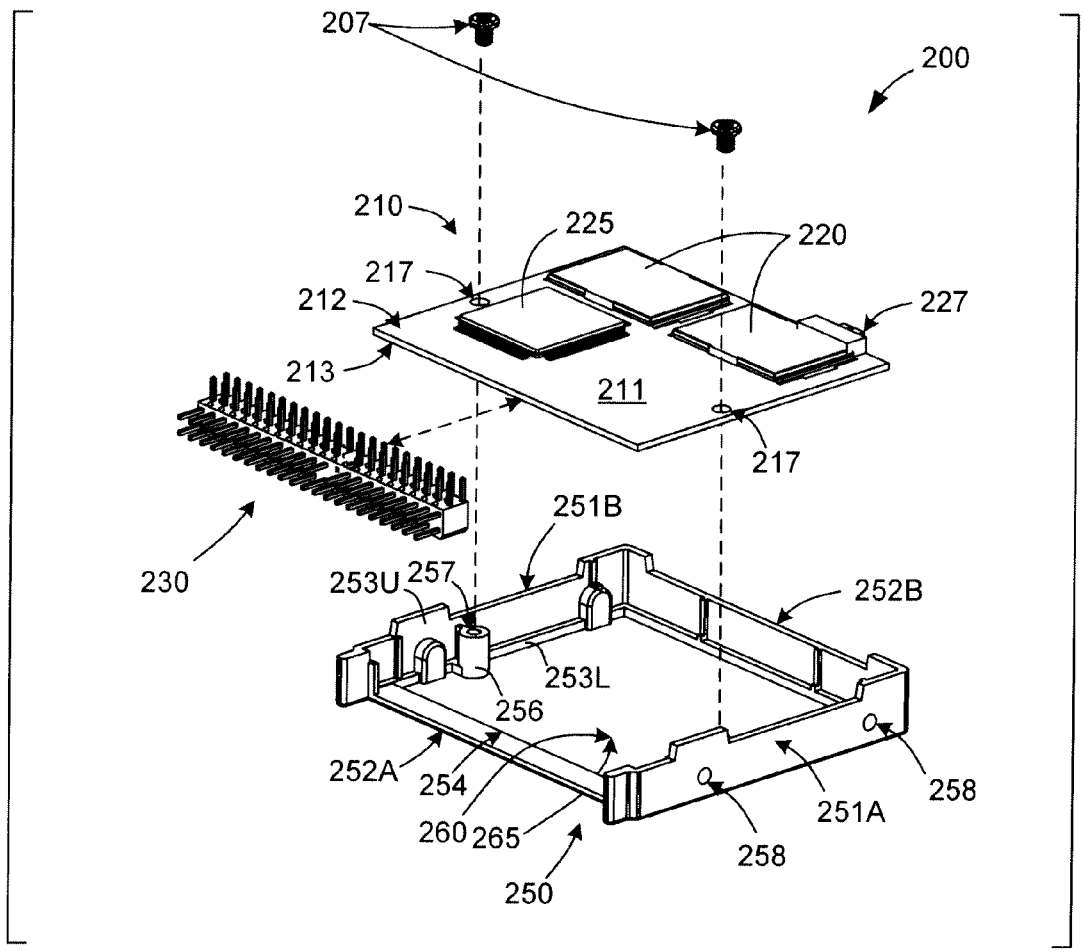
FIGS. 2(A) and 2(B) are exploded perspective and top side perspective views, respectively, showing an 1.3" IDE-type SSD with a frame-type die-cast metal open-frame type housing according to another embodiment of the present invention.
Figure 2B:
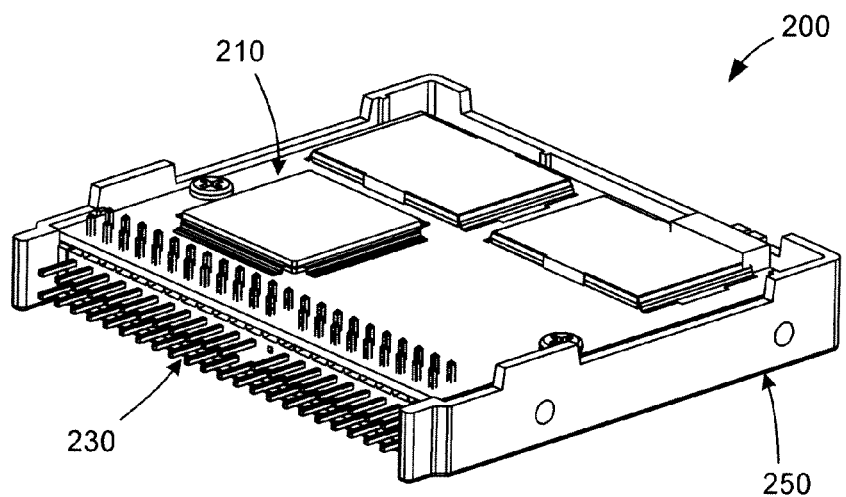

FIGS. 1(A) and 1(B) are exploded perspective and assembled perspective views showing a 3.5" Serial Advance Technology Attachment (SATA) type SSD device 100 including a printed circuit board assembly (PCBA) 110 having an array of memory chips 120, a controller chip 125 and a connector 130 mounted thereon, and an open-frame support-type housing 150 according to a first specific embodiment of the present invention. Referring to the upper portion of FIG. 1(A), PCBA 110 includes a circuit board 111 having opposing upper and lower surfaces 112 and 113. Circuit board 111 that is fabricated using known printed circuit board technology to include conductive traces (not shown) disposed on and between layers of non-conductive material (e.g., FR4) such that signals are passed between the various components mounted thereon (e.g., memory chips 120 and controller chip 125) and contact pads 114, which serve to pass signals to a host system CPU 50 (see FIG. 1(B)) by way of connector 130. A peripheral edge of circuit board 111 is cut or otherwise formed to include several alignment grooves (recesses) 115 that serve to align circuit board 111 inside housing 150 in the manner described below. Several screw holes 117 are defined through circuit board 111 at predetermined locations to facilitate connection of printed circuit board 111 to housing 150 by way of (first) screws 107. At least one collared screw hole 117A includes a metal collar that is electrically connected to a ground plane (not shown) of circuit board 111 by way of metal traces, thereby facilitating automatic ESD protection during the assembly process. Memory chips 120 and controller chip 125 are mounted onto circuit board 111 using, for example, known SMT techniques. Memory chips 120 include non-volatile (e.g., flash-type) memory cells or volatile (e.g., synchronous dynamic access memory (SDRAM)) memory cells that are fabricated and operate according to known standards. Although not shown, one or more additional memory chips 120 may be mounted on lower surface 113. Also according to known standards, controller chip 125 includes a input/output interface circuit for interfacing with a host system CPU 50 (shown in FIG. 1(B)), and a processing unit for accessing memory chips 120 in response to commands from host system CPU 50 received by the input/output interface circuit. Controller chip 125 may also include a phase-lock loop (PLL) circuit and a register or buffer circuit. PCBA 110 serves as the core electronic sub-assembly of SATA SSD device 100. In addition to memory chips 120 and controller chip 125, optional passive components and other logical components and integrated circuits (not shown) are disposed on one or both surfaces 112 and 113. In the disclosed embodiment connector 130 is a standard 22-pin SATA type connector that is electrically connected to controller 125 by way of leads 131 that are soldered to contact pads 114 of circuit boards 111 using surface mounting technology (SMT) techniques according to known practices. The present embodiment may also be used in conjunction with Integrated Drive Electronics (IDE) and Peripheral Component Interconnect Express (PCIE) connector types. Connector 130 is mounted on circuit board 111 such that its socket 135 is accessible for connection to host system CPU 50, e.g., by way of a standard cable (not shown). Open-frame support-type housing 150 is an integral metal frame fabricated by metal die casting. Metal die casting is a manufacturing process by which a molten metal is introduced into a mold, allowed to solidify within the mold, and then the mold is broken open or the molded part is ejected from the die cast mold. Any suitable metal may be used to form housing 150, with aluminum being the typical choice material due to its light weight and relatively low melting point. The surface of housing 150 is either painted with black or color paint. Alternatively, a higher end surface finishing may be used, such as electro-plating a thin layer of metal such as chromium (Cr) on the surfaces of housing 150. Open-frame support-type housing 150 includes opposing first and second side rails (elongated brackets) 151A and 151B, and first and second end rails 152A and 152B that are integrally connected at ends thereof to form a rectangular frame-like structure that surrounds the peripheral edges of PCB 111 when PCBA 110 is mounted onto housing 150 as shown in FIG. 1(B). Each of the side rails and end rails (e.g., end rail 152A) comprises an L-shaped flange having a lower (horizontal) portion 153L and an upper (vertical) portion 153U extending perpendicular to the lower portion 153L. End rail 152A also defines an opened gap 154 for receiving connector 130 when PCBA 110 is mounted onto housing 150, as shown in FIG. 1(B). In accordance with an aspect of the invention, guide posts 155A and alignment posts 155B extend from lower (horizontal) flange portion 153L an disposed on inside surfaces of upper (vertical) flange portion 153U of side rails 151A and 151B. Guide posts 155A and alignment posts 155B are respectively received inside corresponding alignment grooves 115 of circuit board 111 when PCBA 110 is mounted onto housing 150 as shown in FIG. 1(B), thereby providing an automatic mechanism for precisely positioning PCBA 110 to reduce assembly time and minimize manufacturing cost. In accordance with another aspect, housing 150 also includes several support posts 156, each having a screw hole 157 defined therein, which form first connecting structures for securing PCBA 110 to housing 150. Support posts 156 extend from lower (horizontal) flange portion 153L along inside surfaces of upper (vertical) flange portion 153U of side rails 151A and 151B, but are shorter than guide posts 155A and alignment posts 155B. As indicated in FIG. 1(A), support posts 156 receive and support corresponding portions of circuit board 111 during assembly such that screw holes 117 of circuit board 111 are aligned with screw holes 157, thereby facilitating easy connection of printed circuit board 111 to housing 150 by way of screws 107. Note that the height of support posts 156 is selected such that, when fastened to housing 150, PCBA 110 is held in a level (e.g., horizontal) orientation with upper surface 112 level with the horizontal edge of opened gap 154, and is substantially centered with reference to the upper (vertical) portions 153U of side rails 151A and 151B and end rails 152A and 152B. Note also that screws 107 passing through collared screw holes 117A provide an electrical path for ESD currents between PCBA 110 and housing 150. In accordance with another aspect of the invention, outside surface of upper (vertical) portions 153U of each side rail 151A and 151B defines screw holes 158 that form second connecting structures for connecting housing 150 to internal rack frame 55 of host system 50. That is, as indicated in FIG. 1(B), screws 108 are inserted through corresponding holes 58 defined in internal rack frame 55 and extend into screw holes 158, thereby facilitating quick and convenient mounting into host 50. Assembly of SATA SSD device 100 is depicted in FIG. 1(A), and the fully assembled device is shown in FIG. 1(B). In accordance with another aspect of the invention, housing 150 does not include a top cover and a bottom cover, whereby both surfaces 112 and 113 of PCBA 110 are exposed by a corresponding upper opening 160 and lower opening 165, which are respectively defined between side rails 151A and 151B and between end rails 152A and 152B. By omitting top and bottom covers, housing 150 provides lower cost and lighter weight advantages over prior art SSDs, and improves ventilation to cool down memory chips 120 and controller chip 125 more efficiently, thus improving the performance of SSD device 100. Note also that connector 130 is disposed in upper opening 165 (i.e., opened gap 154 communicates with opening 165), thereby facilitating easy assembly by allowing connector 130 to be soldered to PCBA 110 before the assembly process. In accordance with yet another aspect, each taller guide posts 155A defines a screw hole 159 for facilitating connection to other devices (not shown) that may be assembled to internal rack frame 55 of the host system. Upon completing the assembly shown in FIG. 1(B), optional bar code, assembly date code, memory size, origin of manufacturing and other production tracking information are either laser marked or printed on label (not shown) that is stuck onto housing 150 or onto PCBA 110 in a blank (unused) space. FIGS. 2(A) and 2(B) are exploded perspective and assembled perspective views showing a 1.3" IDE type SSD device 200 including a PCBA 210 having an array of memory chips 220, a controller chip 225 and a connector 230 mounted thereon, and an open-frame support-type housing 250 according to a second specific embodiment of the present invention. PCBA 210 is similar to PCBA 110 (described above), and includes a circuit board 211 having opposing upper and lower surfaces 212 and 213. Screw holes 217 are defined through circuit board 211 at predetermined locations to facilitate connection of printed circuit board 211 to housing 250 by way of (first) screws 207. Connector 230 is a standard 40-pin IDE type connector that is electrically connected to controller 225 in a manner similar to that described above. A master/slave switch 227 is disposed on an edge of circuit board 211 opposite to connector 230 that facilitates manual setting of SSD device 200 in either master or slave operating modes. The present embodiment may also be used in conjunction with SATA and PCIE connector types.

Open-frame support-type housing 250 is an integral, die-cast metal frame including opposing first and second side rails (elongated brackets) 251A and 251B, and first and second end rails 252A and 252B that form a rectangular frame-like structure. Side rails 251A and 251B and end rail 252A comprises an L-shaped flange having a lower (horizontal) flange portion 253L and an upper (vertical) flange portion 253U extending perpendicular to the lower portion 253L. End rail 252A includes only lower portion 253L, and defines an opened gap 254 for receiving connector 230. Side rails 251A and 251B, and end rail 252A define a rectangular opening that is sized to snuggly receive PCBA 210.

Housing 250 includes several support posts 256, each having a screw hole 257 defined therein, which form first connecting structures for securing PCBA 210 to housing 250. Support posts 256 extend from lower (horizontal) flange portion 253L along inside surfaces of upper (vertical) flange portion 253U of side rails 251A and 251B. As indicated in FIG. 2(A), support posts 256 receive and support corresponding portions of circuit board 211 during assembly such that screw holes 217 of circuit board 211 are aligned with screw holes 257, thereby facilitating easy connection of printed circuit board 211 to housing 250 by way of screws 207. Outside surface of upper (vertical) portions 253U of each side rail 251A and 251B defines screw holes 258 that form second connecting structures for connecting housing 250 to internal rack frame of host system (not shown) in a manner similar to that described above.

Assembly of IDE SSD device 200 is depicted in FIG. 2(A), and the fully assembled device is shown in FIG. 2(B). As with the earlier embodiments, housing 250 does not include a top cover and a bottom cover, whereby both surfaces 212 and 213 of PCBA 210 are exposed by a corresponding upper opening 260 and lower opening 265, which are respectively defined between side rails 251A and 251B and between end rails 252A and 252B. Upon completing the assembly shown in FIG. 2(B), optional bar code, assembly date code, memory size, origin of manufacturing and other production tracking information are either laser marked or printed on label (not shown) that is stuck onto housing 250 or onto PCBA 210 in a blank (unused) space.

Figure 3A:
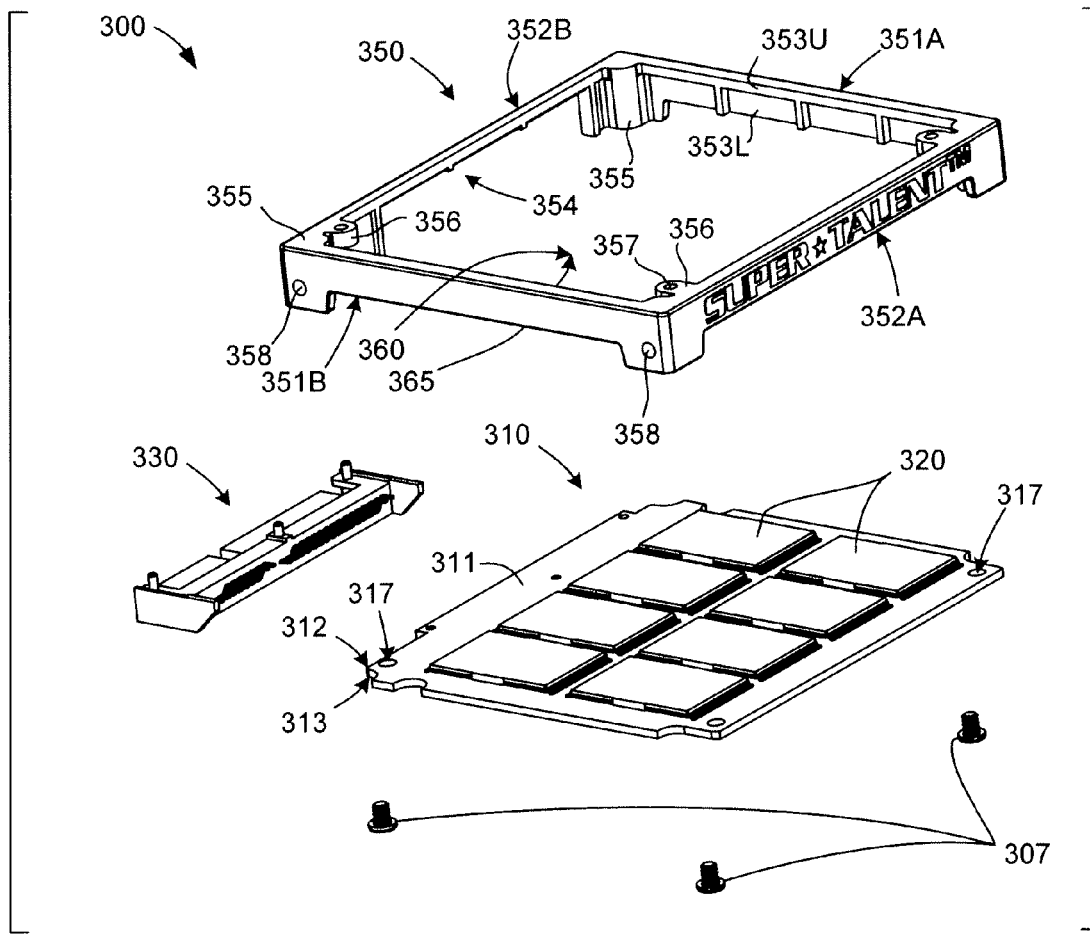
FIGS. 3(A) and 3(B) are exploded perspective and top side perspective views, respectively, showing an 1.8" SATA-type SSD with a frame-type die-cast metal open-frame type housing according to another embodiment of the present invention.
Figure 3B:
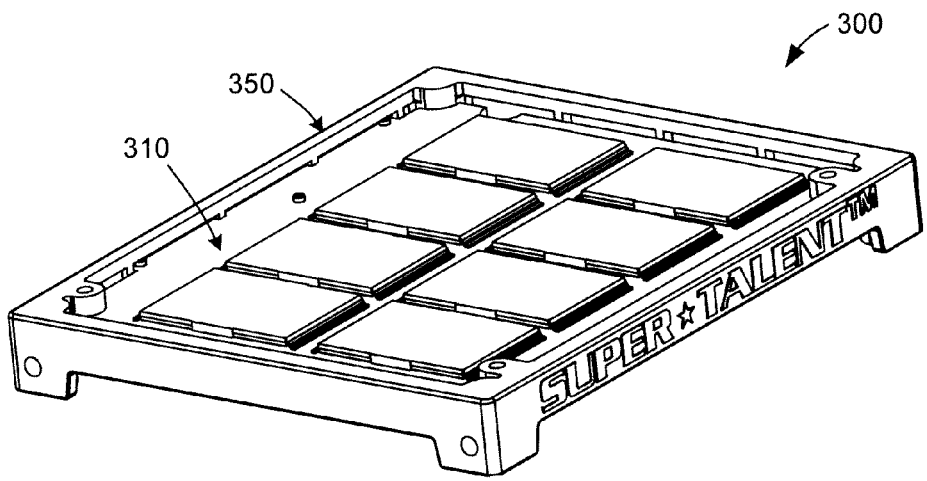

FIGS. 3(A) and 3(B) are exploded perspective and assembled perspective views showing a 1.8" SATA type SSD device 300 including a PCBA 310 having an array of memory chips 320, a controller chip (not shown) and a connector 330 mounted thereon, and an open-frame support-type housing 350 according to a third specific embodiment of the present invention. PCBA 310 is similar to PCBA 110 (described above), and includes a circuit board 311 having opposing upper and lower surfaces 312 and 313. Screw holes 317 are defined through circuit board 311 at predetermined locations to facilitate connection of printed circuit board 311 to housing 350 by way of (first) screws 307. Connector 330 is a standard 22-pin SATA type connector that is electrically connected to controller 325 in a manner similar to that described above. The present embodiment may also be used in conjunction with IDE and PCIE connector types.

Open-frame support-type housing 350 is an integral, die-cast metal frame including opposing first and second side rails (elongated brackets) 351A and 351B, and first and second end rails 352A and 352B that form a rectangular frame-like structure. Side rails 351A and 351B and end rail 352A comprise L-shaped flanges having an upper (horizontal) flange portion 353U and a lower (vertical) flange portion 353L extending perpendicular to the upper portion 353U. Side rails 351A and 351B and end rails 352A and 352B define a rectangular opening that is sized to snuggly receive PCBA 310, and end rail 352B defines an opening gap 354 for receiving connector 330.

Housing 350 includes four corner posts 355 and three support posts 356, each support post having a screw hole 357 defined therein, which form first connecting structures for securing PCBA 310 to housing 350. Support posts 356 extend from upper (horizontal) flange portion 353U along inside surfaces of lower (vertical) flange portion 353L. As indicated in FIG. 3(A), support posts 356 receive and support corresponding portions of circuit board 311 during assembly such that screw holes 317 of circuit board 311 are aligned with screw holes 357, thereby facilitating easy connection of printed circuit board 311 to housing 350 by way of screws 307. Outside surface of lower (vertical) portions 353L of each side rail 351A and 351B defines screw holes 358 that form second connecting structures for connecting housing 350 to internal rack frame of host system (not shown) in a manner similar to that described above.

Assembly of SATA SSD device 300 is depicted in FIG. 3(A), and the fully assembled device is shown in FIG. 3(B). As with the earlier embodiments, housing 350 does not include a top cover and a bottom cover, whereby both surfaces 312 and 313 of PCBA 310 are exposed by a corresponding upper opening 360 and lower opening 365, which are respectively defined between side rails 351A and 351B and between end rails 352A and 352B. Upon completing the assembly shown in FIG. 3(B), optional bar code, assembly date code, memory size, origin of manufacturing and other production tracking information are either laser marked or printed on label (not shown) that is stuck onto housing 350 or onto PCBA 310 in a blank (unused) space.

Figure 4A:
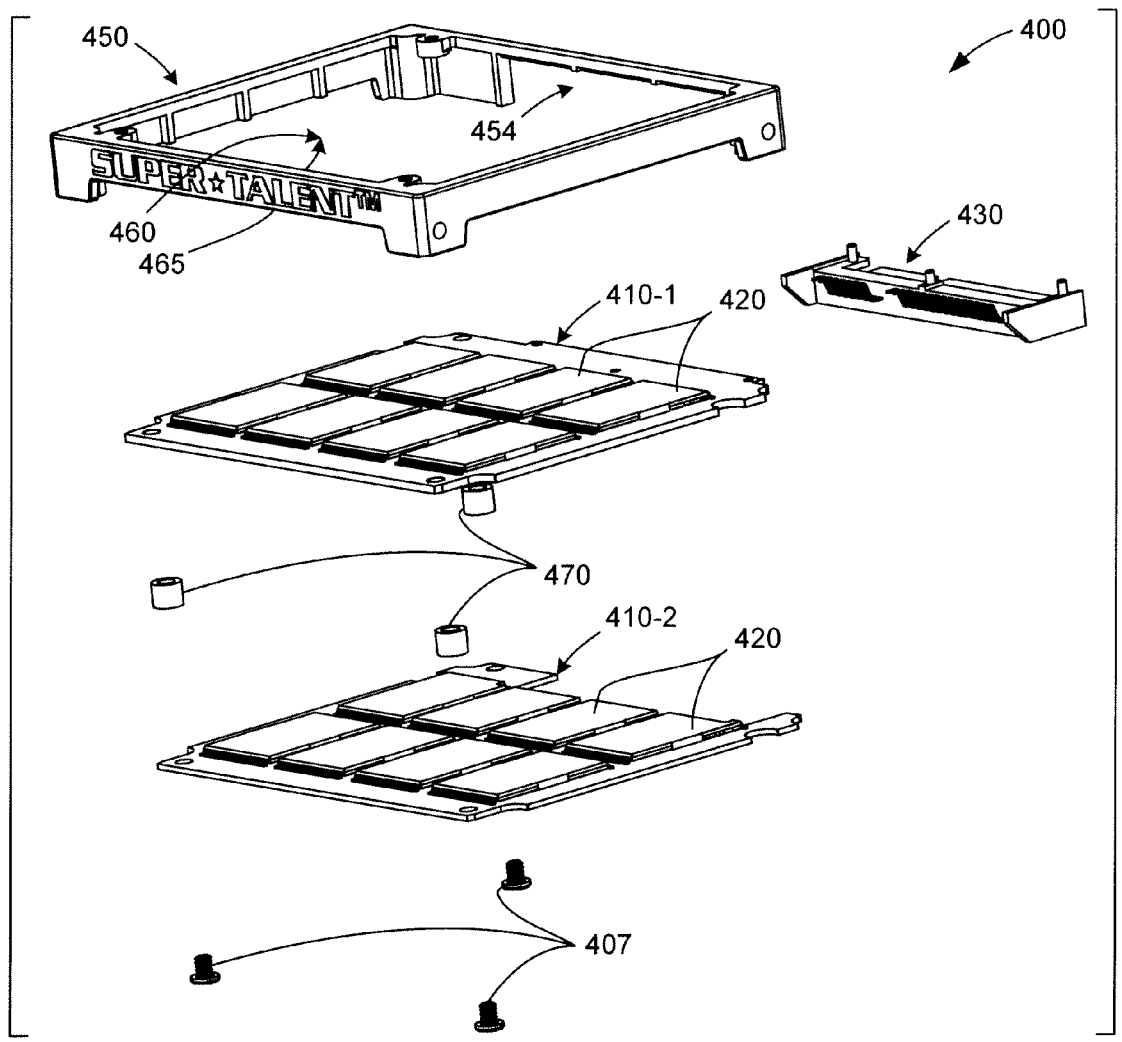
FIGS. 4(A) and 4(B) are exploded perspective and top side perspective views, respectively, showing an 1.8" stacked-type SATA-type SSD with a frame-type die-cast metal open-frame type housing according to another embodiment of the present invention.
Figure 4B:
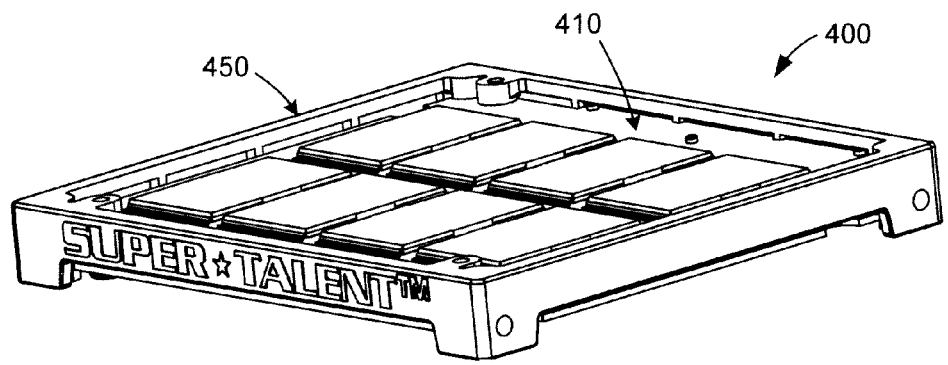

FIGS. 4(A) and 4(B) are exploded perspective and assembled perspective views showing a 1.8" stacked SATA type SSD device 400 including two PCBAs 410-1 and 410-2, each having an array of memory chips 420, a controller chip (not shown) and a connector 430-1, 430-2 mounted thereon, and an open-frame support-type housing 450 according to a fourth specific embodiment of the present invention. SSD device 400 is essentially identical to SSD device 300, with the exception that open-frame support-type housing 450 is configured to receive both PCBAs 410-1 and 410-2 with rubber spacers 470 therebetween that physically and electrically isolate PCBAs 410-1 and 410-2, and that position PCBAs 410-1 and 410-2 such that connectors 430-1, 430-2 are both exposed through an opened gap 454. As with the earlier embodiments, housing 450 does not include a top cover and a bottom cover, whereby exposed surfaces of PCBAs 410-1 and 410-2 are exposed by a corresponding upper opening 460 and lower opening 465.

Figure 5A:
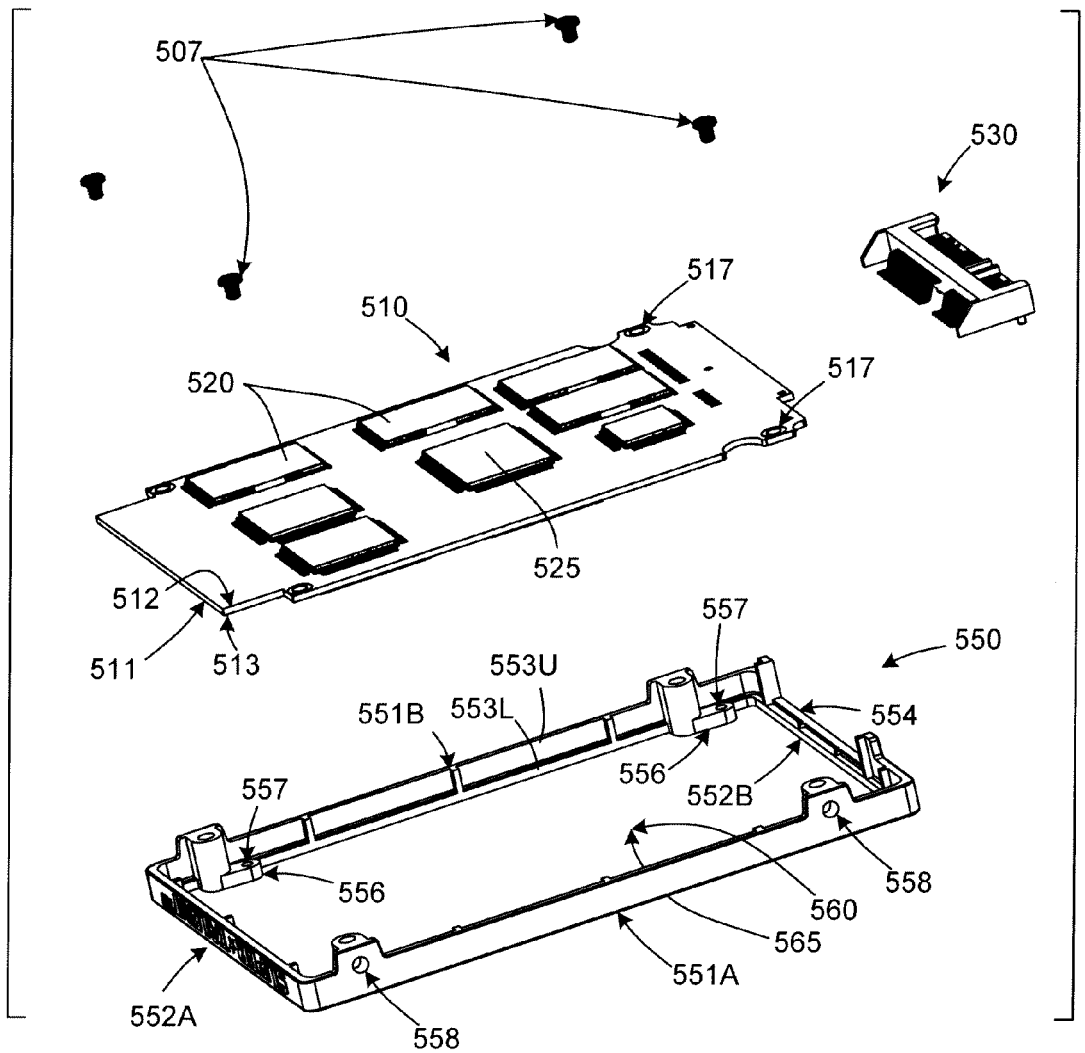
FIGS. 5(A) and 5(B) are exploded perspective and top side perspective views, respectively, showing an 2.5" SATA-type SSD with a frame-type die-cast metal open-frame type housing according to another embodiment of the present invention.
Figure 5B:
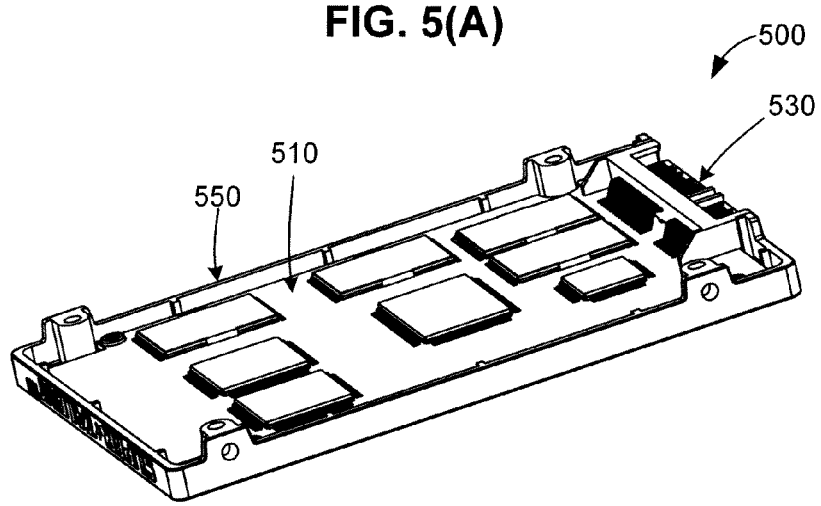

FIGS. 5(A) and 5(B) are exploded perspective and assembled perspective views showing a 2.5" SATA type SSD device 500 including a PCBA 510 having an array of memory chips 520, a controller chip 525 and a connector 530 mounted thereon, and an open-frame support-type housing 550 according to a fifth specific embodiment of the present invention. PCBA 510 is similar to PCBA 110 (described above), and includes a circuit board 511 having opposing upper and lower surfaces 512 and 513. Screw holes 517 are defined through circuit board 511 at predetermined locations to facilitate connection of printed circuit board 511 to housing 550 by way of (first) screws 507. Connector 530 is a standard 22-pin SATA type connector that is electrically connected to controller 525 in a manner similar to that described above. The present embodiment may also be used in conjunction with IDE and PCIE connector types.

Open-frame support-type housing 550 is an integral, die-cast metal frame including opposing first and second side rails (elongated brackets) 551A and 551B, and first and second end rails 552A and 552B that form a rectangular frame-like structure. Side rails 551A and 551B and end rail 552A comprises an L-shaped flange having a lower (horizontal) flange portion 553L and an upper (vertical) flange portion 553U extending perpendicular to the lower portion 553L. Side rails 551A and 551B and end rails 552A and 552B define a rectangular opening that is sized to snuggly receive PCBA 510, and end rail 552B defines an opening gap 554 for receiving connector 530.

Housing 550 includes support posts 556, each support post having a screw hole 557 defined therein, which form first connecting structures for securing PCBA 510 to housing 550. Support posts 556 extend from upper (horizontal) flange portion 553U along inside surfaces of lower (vertical) flange portion 553L. As indicated in FIG. 5(A), support posts 556 receive and support corresponding portions of circuit board 511 during assembly such that screw holes 517 of circuit board 511 are aligned with screw holes 557, thereby facilitating easy connection of printed circuit board 511 to housing 550 by way of screws 507. Outside surface of upper (vertical) portions 553U of each side rail 551A and 551B defines screw holes 558 that form second connecting structures for connecting housing 550 to internal rack frame of host system (not shown) in a manner similar to that described above.

Assembly of SATA SSD device 500 is depicted in FIG. 5(A), and the fully assembled device is shown in FIG. 5(B). As with the earlier embodiments, housing 550 does not include a top cover and a bottom cover, whereby both surfaces 512 and 513 of PCBA 510 are exposed by a corresponding upper opening 560 and lower opening 565, which are respectively defined between side rails 551A and 551B and between end rails 552A and 552B.

Figure 6A:
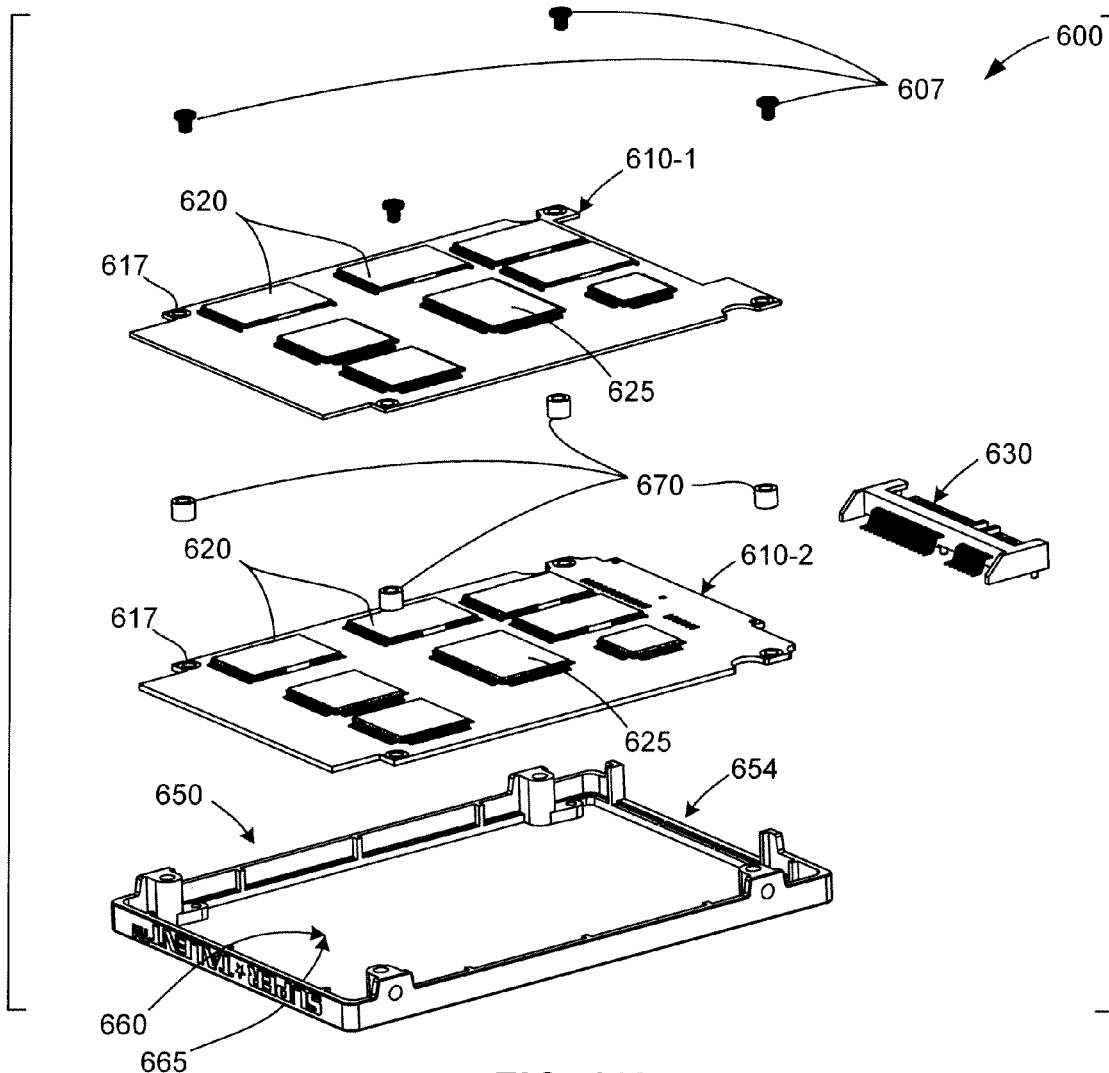
FIGS. 6(A) and 6(B) are exploded perspective and top side perspective views, respectively, showing an 2.5" stacked-type SATA-type SSD with a frame-type die-cast metal open-frame type housing according to another embodiment of the present invention.
Figure 6B:
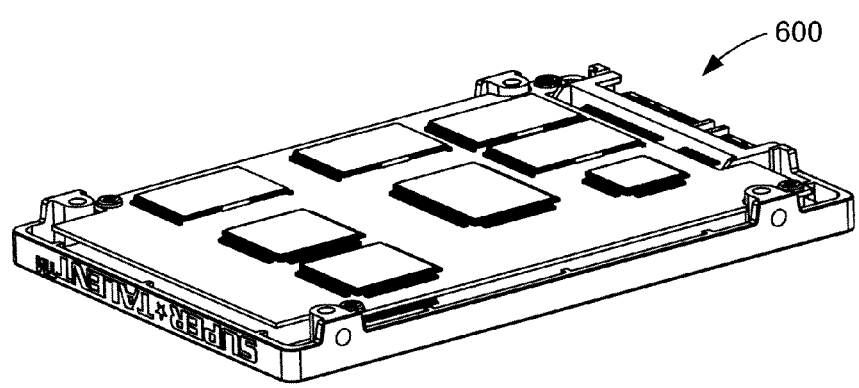

FIGS. 6(A) and 6(B) are exploded perspective and assembled perspective views showing a 2.5" stacked SATA type SSD device 600 including two PCBAs 610-1 and 610-2, each having an array of memory chips 620 and a controller chip 625 mounted thereon, a connector 630, and an open-frame support-type housing 650 according to a sixth specific embodiment of the present invention. SSD device 600 is essentially identical to SSD device 500, with the exception that open-frame support-type housing 650 is configured to receive both PCBAs 610-1 and 610-2 with rubber spacers 670 such that connector 630 is exposed through an opened gap 654. As with the earlier embodiments, housing 650 does not include a top cover and a bottom cover, whereby corresponding surfaces of PCBAs 610-1 and 610-2 are exposed by an upper opening 660 and a lower opening 665.

Figure 7A:
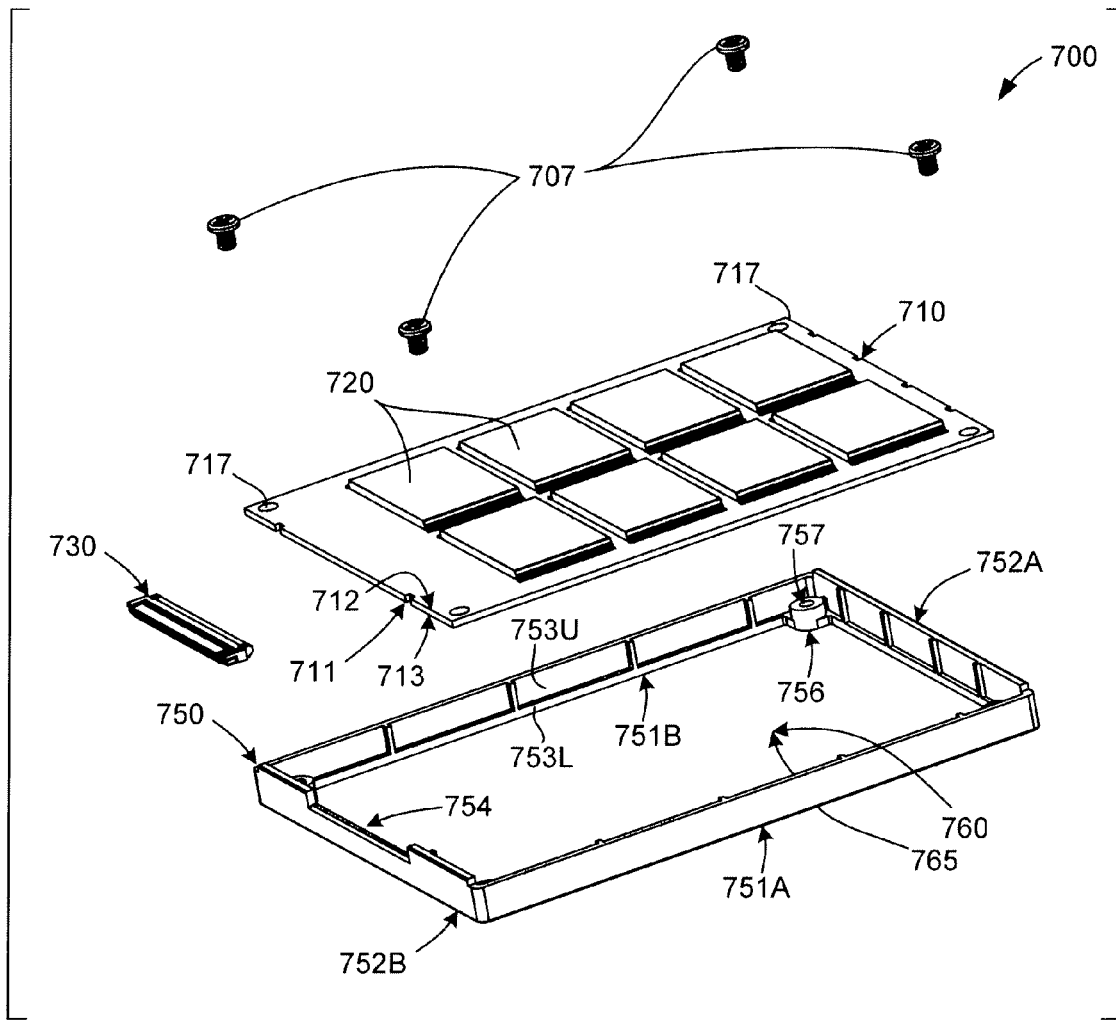
FIGS. 7A) and 7(B) are exploded perspective and top side perspective views, respectively, showing an 1.8" IDE-type (with ZIF connector) SSD with a frame-type die-cast metal open-frame type housing according to another embodiment of the present invention.
Figure 7B:
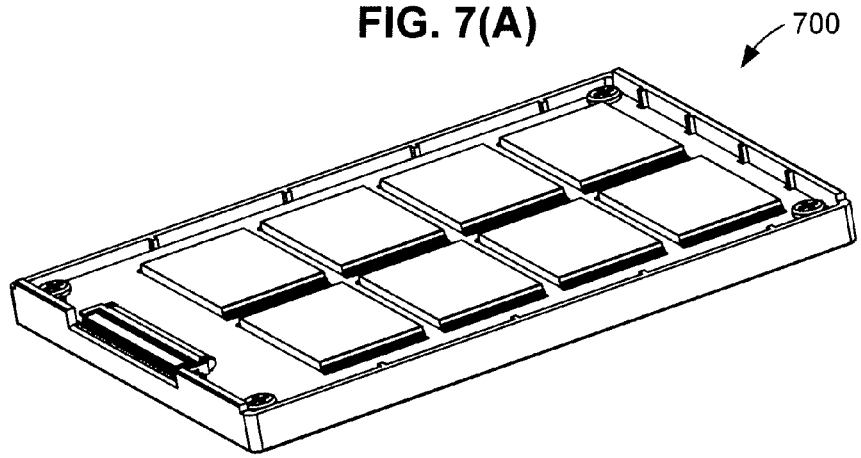

FIGS. 7(A) and 7(B) are exploded perspective and assembled perspective views showing a 1.8" IDE type SSD device 700 including a PCBA 710 having an array of memory chips 720, a controller chip (not shown) and a Zero Insertion Force (ZIF) type connector 730 mounted thereon, and an open-frame support-type housing 750 according to a seventh specific embodiment of the present invention. PCBA 710 is similar to PCBA 110 (described above), and includes a circuit board 711 having opposing upper and lower surfaces 712 and 713. Screw holes 717 are defined through circuit board 711 at predetermined locations to facilitate connection of printed circuit board 711 to housing 750 by way of (first) screws 707. Connector 730 is a standard 40-pin IDE ZIF type connector that is electrically connected to the controller in a manner similar to that described above. The present embodiment may also be used in conjunction with SATA and PCIE connector types.

Open-frame support-type housing 750 is an integral, die-cast metal frame including opposing first and second side rails (elongated brackets) 751A and 751B, and first and second end rails 752A and 752B that form a rectangular frame-like structure. Side rails 751A and 751B and end rail 752A comprises an L-shaped flange having a lower (horizontal) flange portion 753L and an upper (vertical) flange portion 753U extending perpendicular to lower flange portion 753L. Side rails 751A and 751B and end rails 752A and 752B define a rectangular opening that is sized to snuggly receive PCBA 710, and end rail 752B defines an opening gap 754 for receiving connector 730.

Housing 750 includes support posts 756, each support post having a screw hole 757 defined therein, which form first connecting structures for securing PCBA 710 to housing 750. Support posts 756 extend from lower (horizontal) flange portion 753L along inside surfaces of upper (vertical) flange portion 753U. As indicated in FIG. 7(A), support posts 756 receive and support corresponding portions of circuit board 711 during assembly such that screw holes 717 of circuit board 711 are aligned with screw holes 757, thereby facilitating easy connection of printed circuit board 711 to housing 750 by way of screws 707. Outside surface of upper (vertical) portions 753U of each side rail 751A and 751B defines screw holes (not shown) that form second connecting structures for connecting housing 750 to internal rack frame of host system (not shown) in a manner similar to that described above.

Assembly of IDE ZIF SSD device 700 is depicted in FIG. 7(A), and the fully assembled device is shown in FIG. 7(B). As with the earlier embodiments, housing 750 does not include a top cover and a bottom cover, whereby both surfaces 712 and 713 of PCBA 710 are exposed by a corresponding upper opening 760 and lower opening 765, which are respectively defined between side rails 751A and 751B and between end rails 752A and 752B.

The present inventors further realized that the weight of open-frame support-type housings according to the present invention may be further reduced in some embodiments by eliminating the end rails (i.e., by forming the open-frame support-type housings as two separate parts that are disposed on opposite side edges of the PCBA). In addition to reduced weight, such two-part housings are characterized by lower manufacturing costs due to less material, and because the die-cast molds (when used to generate the two parts) are smaller and less expensive to produce and facilitate a higher number of parts per production run. Further, by designing both parts of the two-part housing to be identical structures, a single die mold or other stamping/forming tools may be used to produce both parts, which further simplifies and reduces the cost of manufacturing the housing.

Figure 8A:
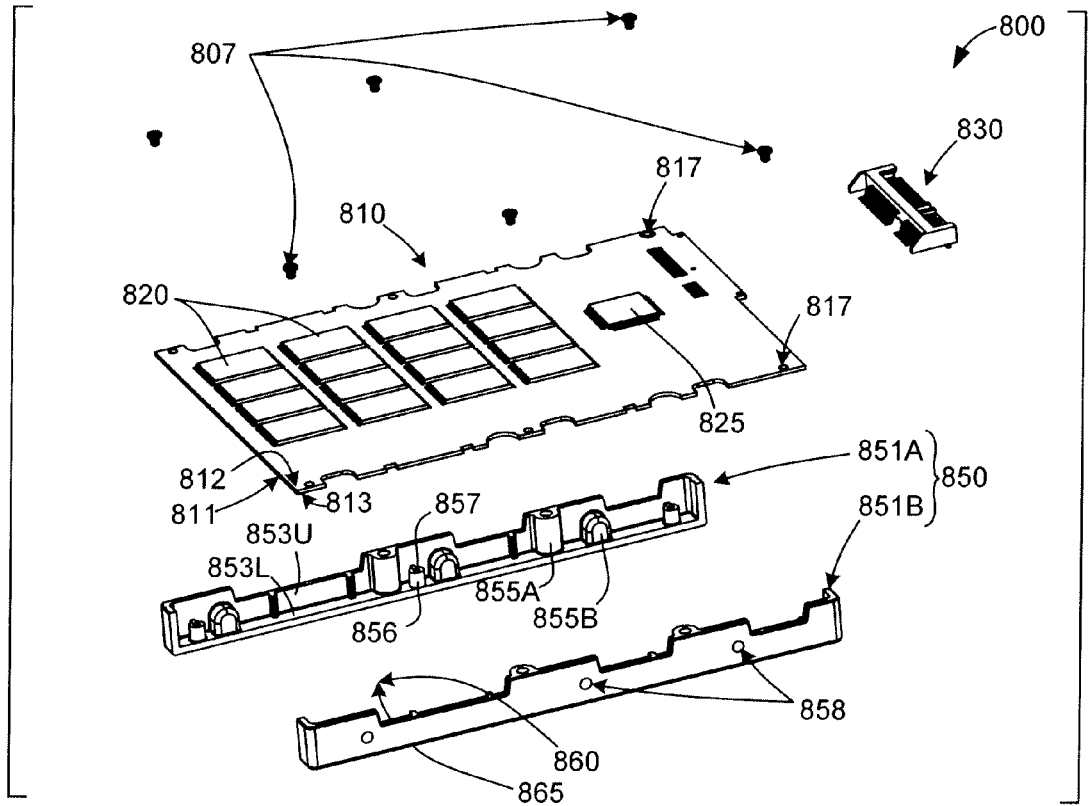
FIGS. 8(A) and 8(B) are exploded perspective and assembled perspective views showing a 3.5" SATA-type SSD device with a two-part, die-cast metal, open-frame support-type housing according to an embodiment of the present invention.
Figure 8B:
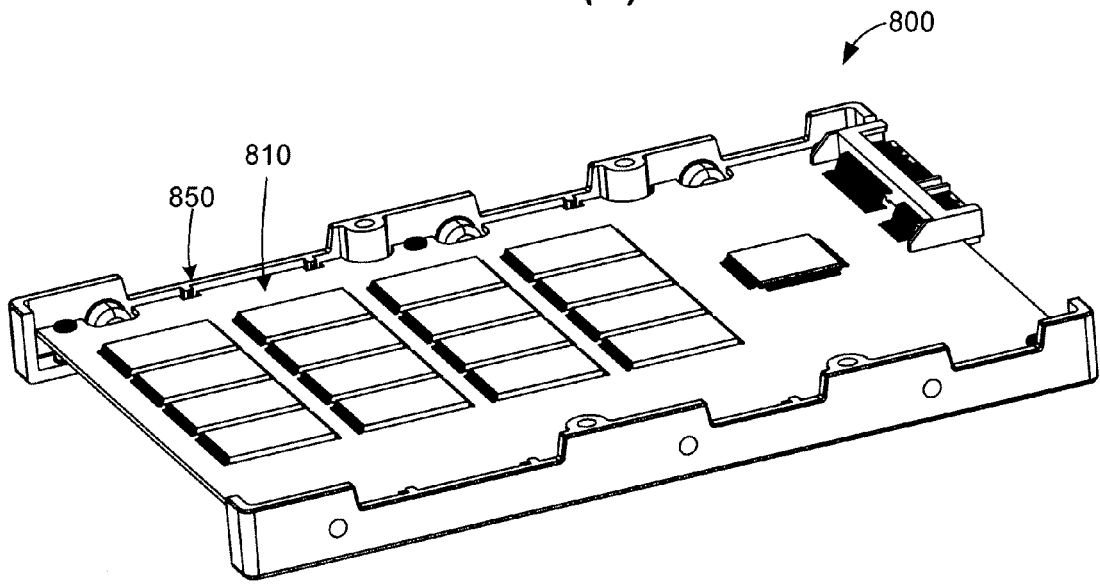

FIGS. 8(A) and 8(B) are exploded perspective and assembled perspective views showing a 3.5" SATA type SSD device 800 including a PCBA 810 having an array of memory chips 820, a controller chip 825, and a SATA type connector 830 mounted thereon, and a two-part, open-frame support-type housing 850 according to an eighth specific embodiment of the present invention. PCBA 810 is similar to PCBA 110 (described above), and includes a circuit board 811 having opposing upper and lower surfaces 812 and 813. Screw holes 817 are defined through circuit board 811 at predetermined locations to facilitate connection of printed circuit board 811 to housing 850 by way of (first) screws 807. Connector 830 is a standard 22-pin SATA type connector that is electrically connected to controller 825 in a manner similar to that described above.

Referring to FIG. 8(A), housing 850 comprises die-cast, opposing first and second elongated brackets (side rails) 851A and 851B that are essentially identical to side rails 151A and 151B of housing 150 (described above with reference to FIG. 1(A) and FIG. 1(B)), but are independently formed and not connected by end rails (i.e., elongated brackets 851A and 851B connected solely by PCBA 810). First and second parallel elongated brackets 851A and 851B are substantially identical structures in that both can be cast (produced) using the same mold, but may vary slightly due to common manufacturing variances. By utilizing substantially identical bracket structures to form both parts of two-part housing 850, the present invention reduces manufacturing costs by minimizing the number of molds and/or increasing production throughput. Elongated brackets 851A and 851B comprise an L-shaped flange having a lower (horizontal) portion 853L and an upper (vertical) portion 853U extending perpendicular to the lower portion 853L. Each elongated bracket 851A and 851B includes support posts 856, with each support post having a screw hole 857 defined therein, which form first connecting structures for securing PCBA 810 to housing 850 in the manner described above. Support posts 856 extend from lower (horizontal) portion 853L along inside surfaces of upper (vertical) portion 853U. As indicated in FIG. 8(A), support posts 856 receive and support corresponding portions of circuit board 811 during assembly such that screw holes 817 of circuit board 811 are aligned with screw holes 857, thereby facilitating easy connection of printed circuit board 811 to housing 850 by way of screws 807. Each elongated bracket 851A and 851B also includes guide posts 855A and alignment posts 855B that extend from lower (horizontal) flange portion 853L an disposed on inside surfaces of upper (vertical) flange portion 853U that are respectively received inside corresponding alignment grooves formed in circuit board 811 in a manner similar to that described above with reference to FIG. 1(A). Outside surface of upper (vertical) portions 853U of each elongated brackets 851A and 851B defines screw holes 858 that form second connecting structures for connecting housing 850 to internal rack frame of host system (not shown) in a manner similar to that described above.

Assembly of SATA SSD device 800 is depicted in FIG. 8(A), and the fully assembled device is shown in FIG. 8(B). Connector 830 is mounted onto an edge of circuit board 811 that extends between elongated brackets 851A and 851B. As with the earlier embodiments, housing 850 does not include a top cover and a bottom cover, whereby both surfaces 812 and 813 of PCBA 810 are exposed by a corresponding upper opening 860 and lower opening 865, which are respectively defined between side rails 851A and 851B.

Figure 9A:
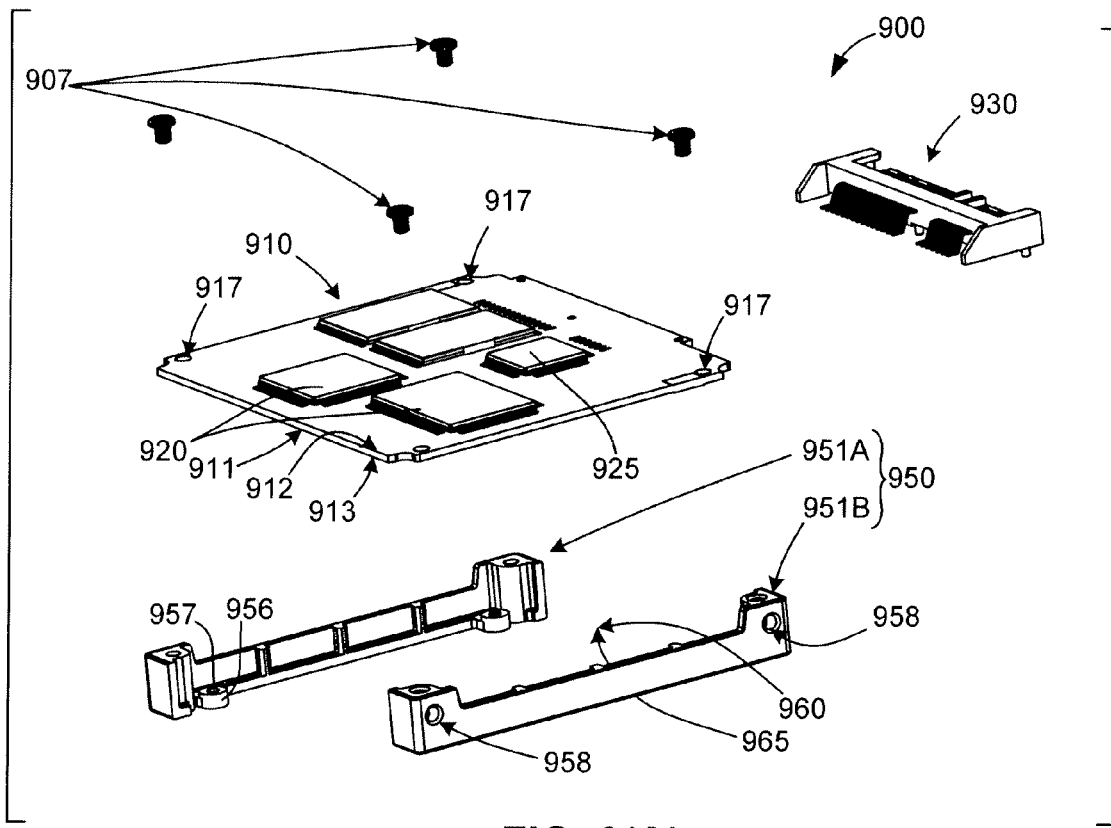
FIGS. 9(A) and 9(B) are exploded perspective and top side perspective views, respectively, showing an 1.8" SATA-type SSD with a two-part, die-cast metal open-frame type housing according to another embodiment of the present invention.
Figure 9B:
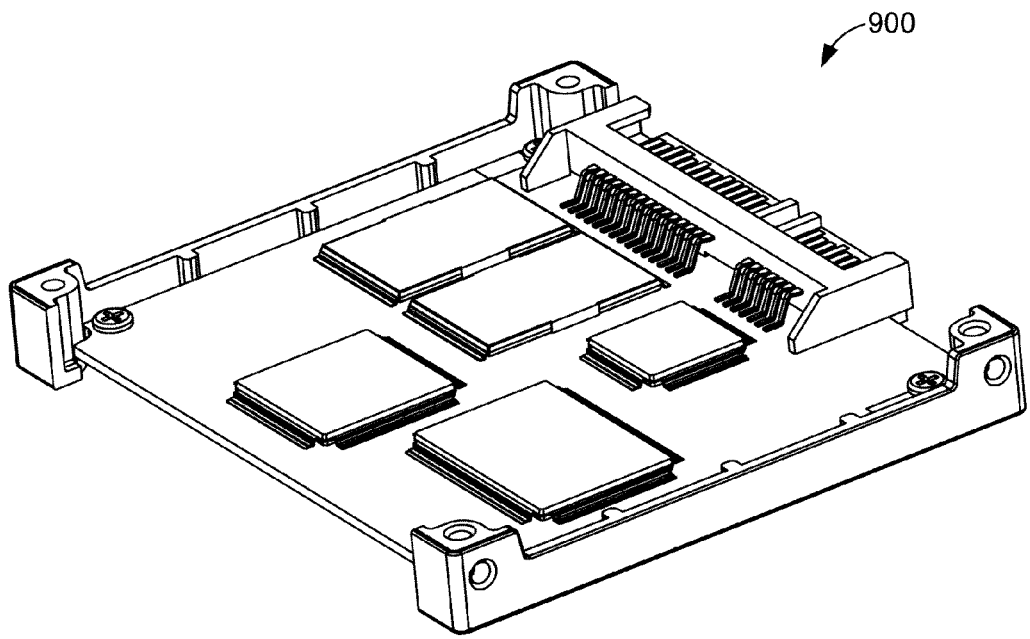

FIGS. 9(A) and 9(B) are exploded perspective and assembled perspective views showing a 1.8" SATA type SSD device 900 including a PCBA 910 having an array of memory chips 920, a controller chip 925, and a SATA type connector 930 mounted thereon, and a two-part, open-frame support-type housing 950 according to a ninth specific embodiment of the present invention. PCBA 910 is similar to PCBA 110 (described above), and includes a circuit board 911 having opposing upper and lower surfaces 912 and 913. Screw holes 917 are defined through circuit board 911 at predetermined locations to facilitate connection of printed circuit board 911 to housing 950 by way of (first) screws 907. Connector 930 is a standard 22-pin SATA type connector that is electrically connected to controller 925 in a manner similar to that described above.

Referring to FIG. 9(A), housing 950 comprises die-cast, opposing first and second elongated brackets (side rails) 951A and 951B that are essentially identical to side rails 351A and 351B of housing 350 (described above with reference to FIG. 3(A)), but are independently formed and not connected by end rails (i.e., elongated brackets 951A and 951B connected solely by PCBA 910). Each elongated bracket 951A and 951B includes support posts 956, with each support post having a screw hole 957 defined therein, which form first connecting structures for securing PCBA 910 to housing 950 by way of screws 907 in the manner described above. Outside surfaces of upper elongated brackets 951A and 951B define screw holes 958 that form second connecting structures for connecting housing 950 to internal rack frame of host system (not shown) in a manner similar to that described above.

Assembly of SATA SSD device 900 is depicted in FIG. 9(A), and the fully assembled device is shown in FIG. 9(B). Connector 930 is mounted onto an edge of circuit board 911 that extends between elongated brackets 951A and 951B. As with the earlier embodiments, housing 950 does not include a top cover and a bottom cover, whereby both surfaces 912 and 913 of PCBA 910 are exposed by a corresponding upper opening 960 and lower opening 965, which are respectively defined between side rails 951A and 951B.

Figure 10A:
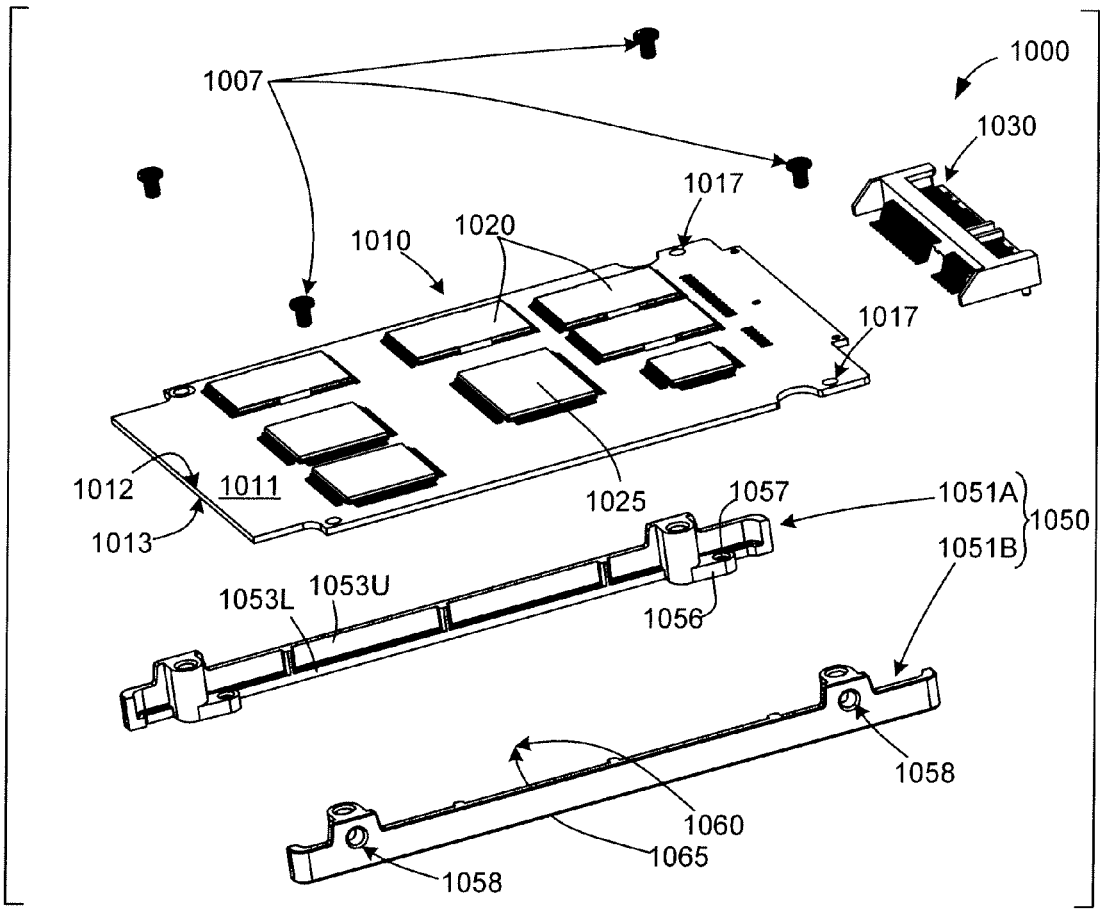
FIGS. 10(A) and 10(B) are exploded perspective and top side perspective views, respectively, showing an 2.5" SATA-type SSD with a two-part, die-cast metal open-frame type housing according to another embodiment of the present invention.
Figure 10B:
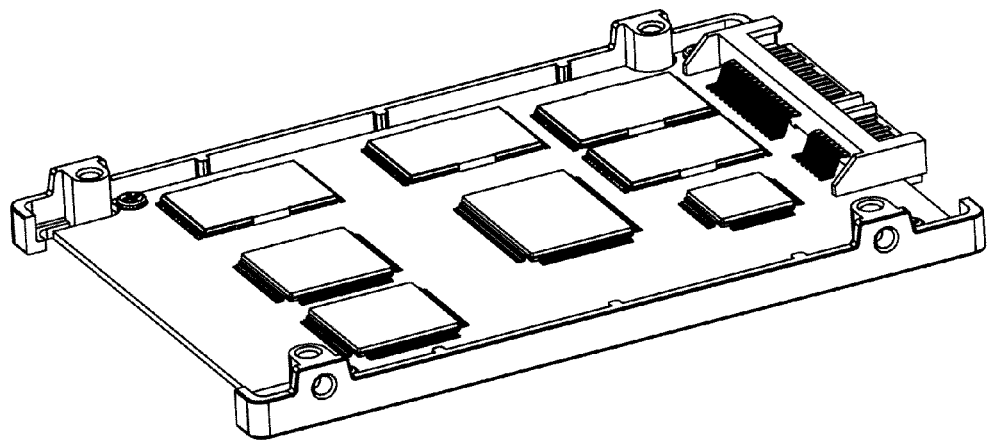

FIGS. 10(A) and 10(B) are exploded perspective and assembled perspective views showing a 2.5" SATA type SSD device 1000 including a PCBA 1010 having an array of memory chips 1020, a controller chip 1025 and a SATA type connector 1030 mounted thereon, and a two-part, open-frame support-type housing 1050 according to a tenth specific embodiment of the present invention. PCBA 1010 is similar to PCBA 110 (described above), and includes a circuit board 1011 having opposing upper and lower surfaces 1012 and 1013. Screw holes 1017 are defined through circuit board 1011 at predetermined locations to facilitate connection of printed circuit board 1011 to housing 1050 by way of (first) screws 1007. Connector 1030 is a standard 22-pin SATA type connector that is electrically connected to controller 1025 in a manner similar to that described above.

Referring to FIG. 10(A), housing 1050 comprises die-cast, opposing first and second elongated brackets (side rails) 1051A and 1051B that are essentially identical to side rails 551A and 551B of housing 550 (described above with reference to FIG. 5(A)), but are independently formed and not connected by end rails (i.e., elongated brackets 1051A and 1051B connected solely by PCBA 1010). Each elongated bracket 1051A and 1051B includes support posts 1056, with each support post having a screw hole 1057 defined therein, which form first connecting structures for securing PCBA 1010 to housing 1050 by way of screws 1007 in the manner described above. Outside surfaces of upper elongated brackets 1051A and 1051B define screw holes 1058 that form second connecting structures for connecting housing 1050 to internal rack frame of host system (not shown) in a manner similar to that described above.

Assembly of SATA SSD device 1000 is depicted in FIG. 10(A), and the fully assembled device is shown in FIG. 10(B). Connector 1030 is mounted onto an edge of circuit board 1011 that extends between elongated brackets 1051A and 1051B. As with the earlier embodiments, housing 1050 does not include a top cover and a bottom cover, whereby both surfaces 1012 and 1013 of PCBA 1010 are exposed by a corresponding upper opening 1060 and lower opening 1065, which are respectively defined between side rails 1051A and 1051B.

In another alternative, the two-part housings described above may be stamped/formed from sheet metal using known techniques. Stamping and forming represents the most efficient and low cost solution for manufacture brackets for all types of SSD drives. In addition, by utilizing identical bracket designs for mount each side of the PCBA, the same stamping/forming equipment may be used for both brackets, thereby simplifying the manufacturing process and further reducing manufacturing costs. The metal used to form brackets 1151A and 1151B also serves as an ESD discharge path by way of the connecting screws.

Figure 11A:
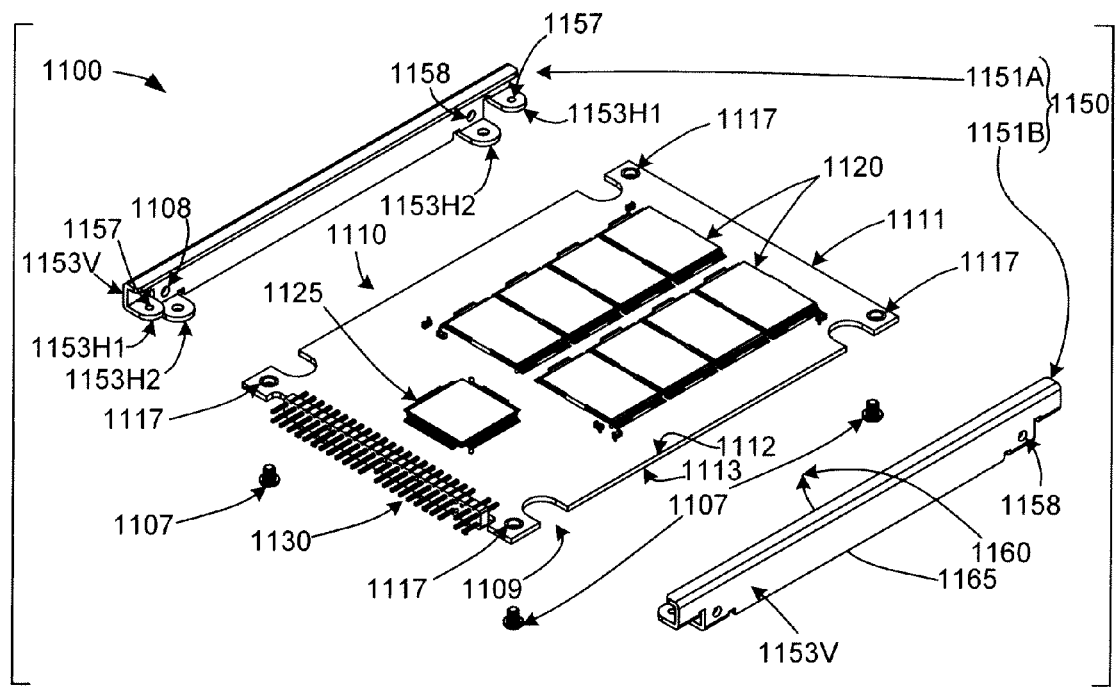
FIGS. 11(A) and 11(B) are exploded perspective and top side perspective views, respectively, showing an 2.5" IDE-type SSD with a two-part, stamped metal open-frame type housing according to another embodiment of the present invention.
Figure 11B:
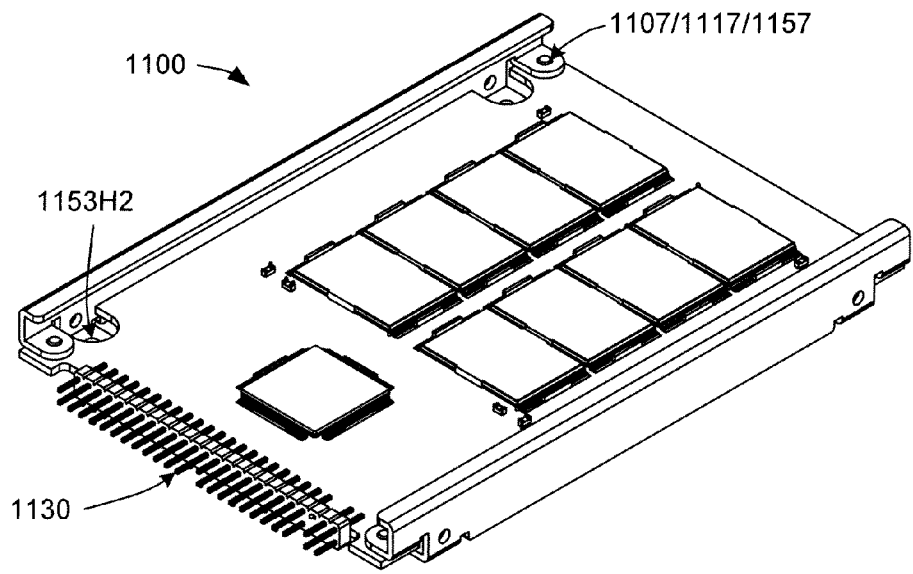

FIGS. 11(A) and 11(B) are exploded perspective and assembled perspective views showing a 2.5" IDE type SSD device 1100 including a PCBA 1110 having an array of memory chips 1120, a controller chip 1125 and an IDE type connector 1130 mounted thereon, and a two-part, open-frame support-type housing 1150 according to an eleventh specific embodiment of the present invention. PCBA 1110 is similar to PCBA 110 (described above), and includes a circuit board 1111 having opposing upper and lower surfaces 1112 and 1113. Screw holes 1117 are defined through circuit board 1111 at predetermined locations to facilitate connection of printed circuit board 1111 to housing 1150 by way of (first) screws 1107. Connector 1130 is an IDE type connector that is electrically connected to controller 1125 in a manner similar to that described above.

Referring to FIG. 11(A), housing 1150 comprises stamped and formed opposing first and second elongated brackets (side rails) 1151A and 1151B that are independently formed (i.e., not connected by end rails) such that elongated brackets 1151A and 1151B connected solely by PCBA 1110), and are symmetrical (substantially identical). Each bracket 1151A and 1151B comprises a vertical flange portion 1153V and a several horizontal flange portions 1153H1 and 1153H2 extending perpendicular to vertical flange portion 1153V. Each of the centrally located horizontal flange portions 1153H1 defines an associated first screw hole 1157, which are used to attached PCBA 1110 by way of screws 1107. The metal used to form brackets 1151A and 1151B also serves as an ESD discharge path by way of screws 1107 that extend through corresponding screw holes 1117 in PCBA 1110, and holes 1157 in horizontal flange portions 1153H1 to electrically connect brackets 1151A and 1151B with the ground plane of PCBA 1105 by way of ground rings/holes (metal collars, not shown) that surround holes 1157. Each of the lower horizontal flange portions 1153H2 are used to attach SSD 1100 to other devices (not shown). As indicated in FIG. 11(B), four notches are defined in the peripheral edge of PCBA 1110 that are aligned with lower horizontal flange portions 1153H2—these notches are redundant and the space can be claimed for extra layout real estate for PCBA 1110. Outside surfaces of upper elongated brackets 1151A and 1151B define (third) screw holes 1158 that form second connecting structures for connecting housing 1150 to internal rack frame of host system (not shown) in a manner similar to that described above.

Assembly of SATA SSD device 1100 is depicted in FIG. 11(A), and the fully assembled device is shown in FIG. 11(B). Connector 1130 is mounted onto an edge of circuit board 1111 that extends between elongated brackets 1151A and 1151B. As with the earlier embodiments, housing 1150 does not include a top cover and a bottom cover, whereby both surfaces 1112 and 1113 of PCBA 1110 are exposed by a corresponding upper opening 1160 and lower opening 1165, which are respectively defined between side rails 1151A and 1151B.

In another alternative to the present invention, each bracket of the two-part housings may be formed as a two-part clamp structure that is either die-cast or stamped/formed from sheet metal using known techniques. The two-part clamp structures described in the embodiments below add rigidity to the two-part housing concept of the present invention which helps to protect the associated PCBA when the PCBA does not provide sufficient rigidity by itself. Another benefit of the two-part clamp structure is that it maximizes the usable PCBA real estate by reducing the guide post protrusions.

Figure 12A:
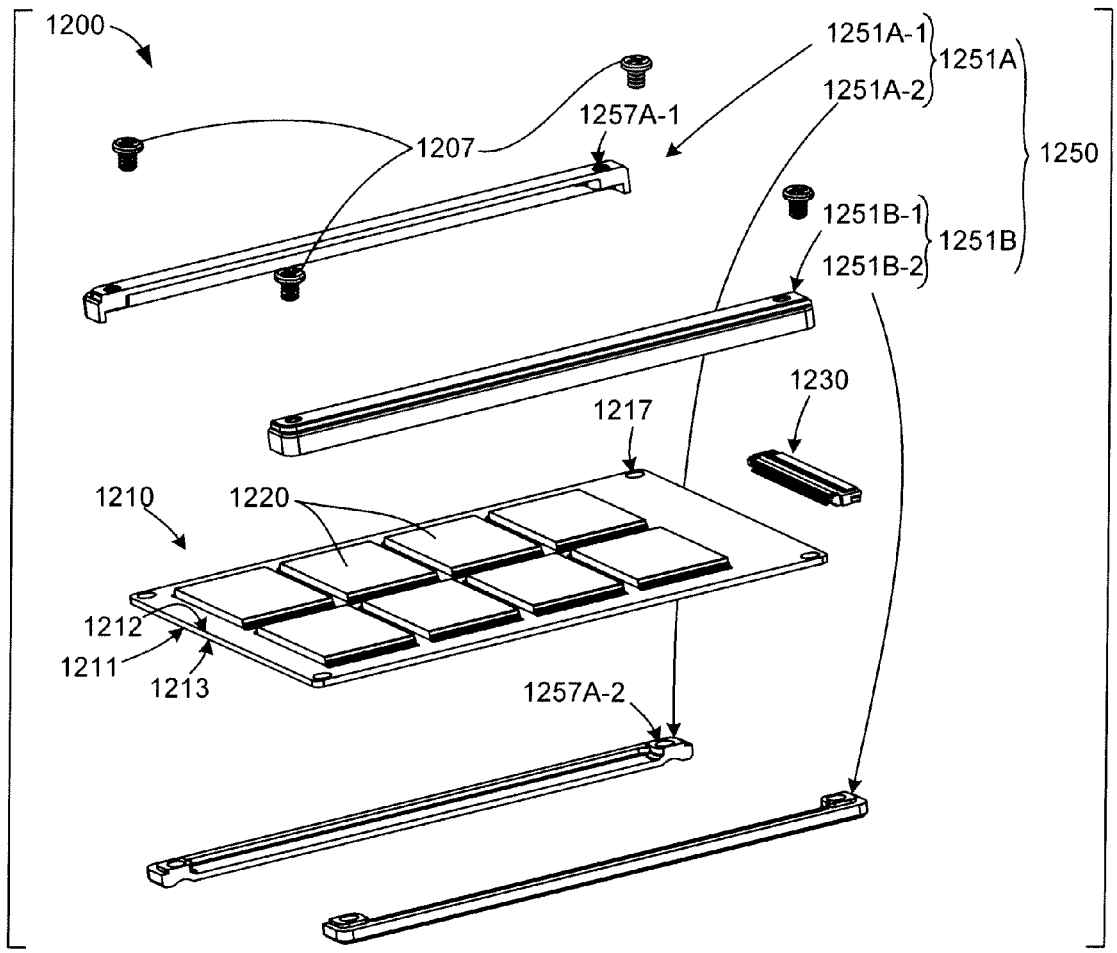
FIGS. 12(A) and 12(B) are exploded perspective and top side perspective views, respectively, showing an 2.8" SATA-type SSD with a two-part, clamp-type, die-cast metal open-frame type housing according to another embodiment of the present invention.
Figure 12B:
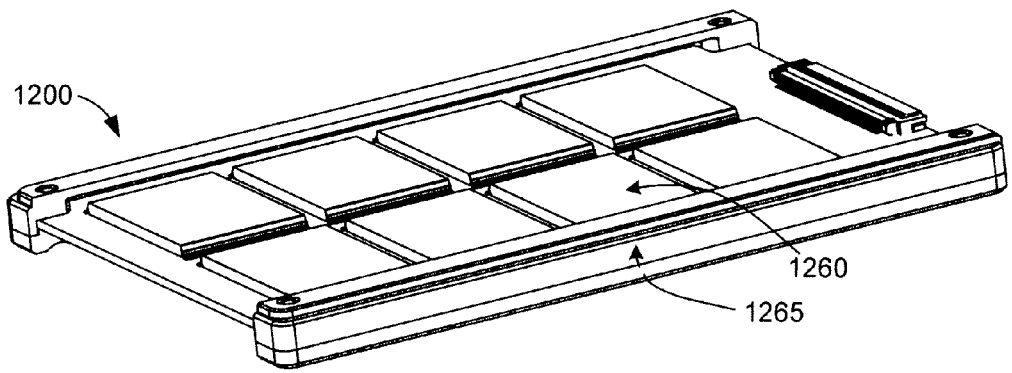

FIGS. 12(A) and 12(B) are exploded perspective and assembled perspective views showing a 1.8" ZIF SATA type SSD device 1200 including a PCBA 1210 having an array of memory chips 1220, a controller chip (not shown) and a SATA type connector 1230 mounted thereon, and a two-part, open-frame support-type housing 1250 according to an twelfth specific embodiment of the present invention. PCBA 1210 is similar to PCBA 110 (described above), and includes a circuit board 1211 having opposing upper and lower surfaces 1212 and 1213. Screw holes 1217 are defined through circuit board 1211 at predetermined locations to facilitate connection of printed circuit board 1211 to housing 1250 by way of (first) screws 1207. Connector 1230 is a ZIF-type SATA connector that is electrically connected to the controller in a manner similar to that described above.

Referring to FIG. 12(A), housing 1250 comprises opposing first and second elongated brackets (side rails) 1251A and 1251B, where each bracket includes opposing clamp structures that are clamped to side edges of PCBA 1210 such that elongated brackets 1251A and 1251B are connected solely by PCBA 1210. First elongated bracket 1251A includes a lower clamp structure 1251A-1 and an upper clamp structure 1251A-2, and second elongated bracket 1251B includes a lower clamp structure 1251B-1 and an upper clamp structure 1251B-2. Each lower clamp structure 1251A-1 and 1251B-1 is substantially identical (i.e., formed using the same die mold), and each upper clamp structure 1251A-2 and 1251B-2 is also substantially identical. Each clamp structure defines multiple screw holes that are aligned with corresponding screw holes 1217 formed in PCBA 1210 to facilitate the clamping process. For example, lower clamp structure 1251A-1 includes first screw holes 1257A-1 that are aligned with a corresponding second screw hole 1217 of PCBA 1210 and a corresponding third screw hole 1257A-2 defined through upper clamp structure 1251A-2, which connected by way of an associated screw 1207 during the clamping process. The metal used to form brackets 1251A and 1251B also serves as an ESD discharge path by way of screws 1207.

Assembly of SATA SSD device 1200 is depicted in FIG. 12(A), and the fully assembled device is shown in FIG. 12(B). Connector 1230 is mounted onto an edge of circuit board 1211 that extends between elongated brackets 1251A and 1251B. As with the earlier embodiments, housing 1250 does not include a top cover and a bottom cover, whereby both surfaces 1212 and 1213 of PCBA 1210 are exposed by a corresponding upper opening 1260 and lower opening 1265, which are respectively defined between side rails 1251A and 1251B.

Figure 13A:
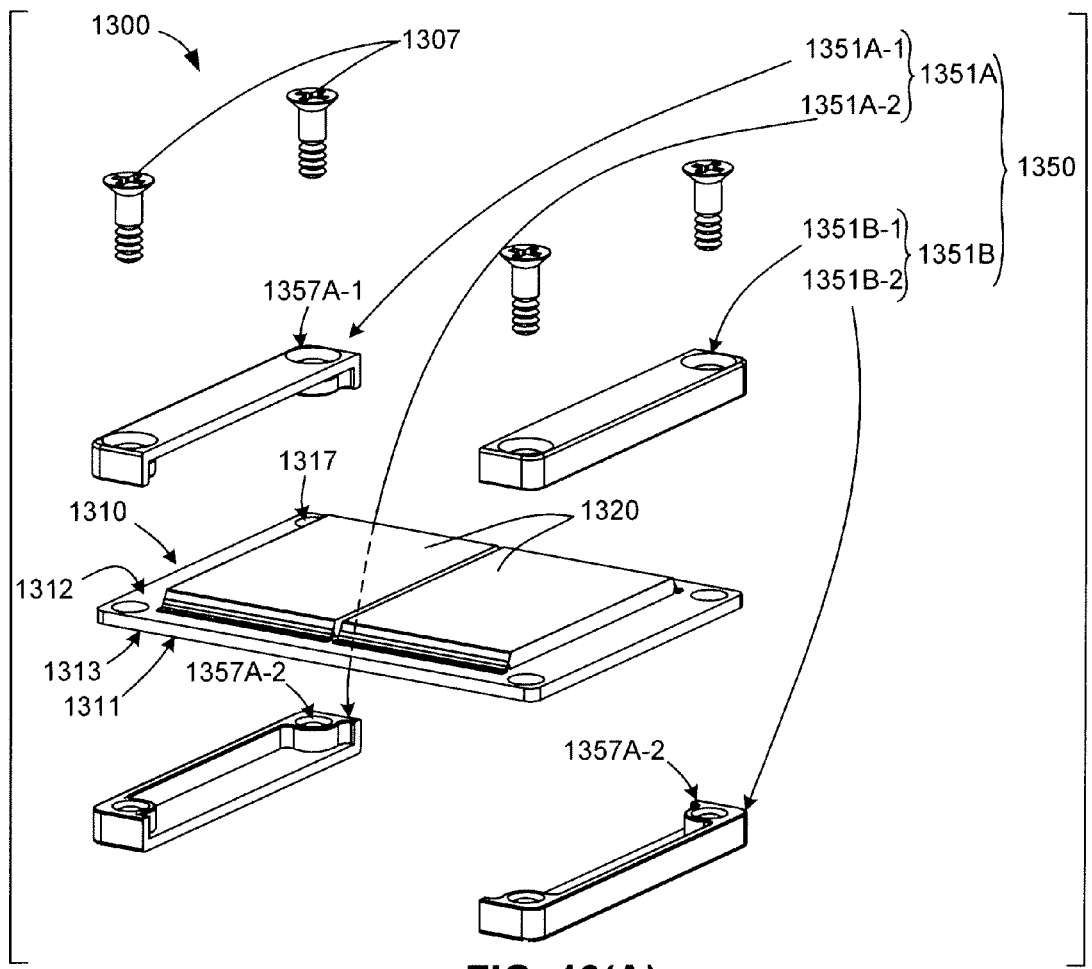
FIGS. 13(A) and 13(B) are exploded perspective and top side perspective views, respectively, showing an 0.85" ZIF SATA-type SSD with a two-part, clamp-type, die-cast metal open-frame type housing according to another embodiment of the present invention.
Figure 13B:
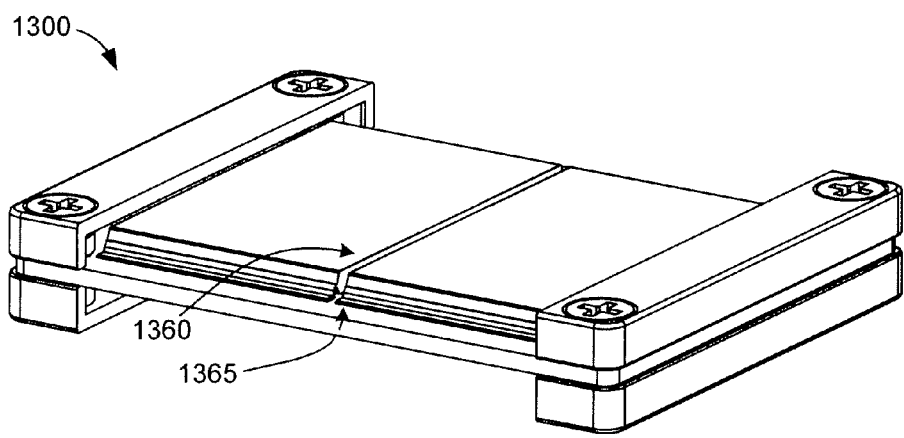

FIGS. 13(A) and 13(B) are exploded perspective and assembled perspective views showing a 0.85" ZIF SATA type SSD device 1300 including a PCBA 1310 having memory chips 1320, a controller chip (not shown) and a ZIF SATA type connector (not shown) mounted thereon, and a two-part, open-frame, clamp-type support-type housing 1350 according to an thirteenth specific embodiment of the present invention. PCBA 1310 is similar to PCBA 110 (described above), and includes a circuit board 1311 having opposing upper and lower surfaces 1312 and 1313. Screw holes 1317 are defined through circuit board 1311 at predetermined locations to facilitate connection of printed circuit board 1311 to housing 1350 by way of (first) screws 1307.

Referring to FIG. 13(A), housing 1350 comprises opposing first and second elongated brackets (side rails) 1351A and 1351B, where each bracket includes opposing clamp structures that are clamped to side edges of PCBA 1310 such that elongated brackets 1351A and 1351B are connected solely by PCBA 1310. First elongated bracket 1351A includes a lower clamp structure 1351A-1 and an upper clamp structure 1351A-2, and second elongated bracket 1351B includes a lower clamp structure 1351B-1 and an upper clamp structure 1351B-2. Each lower clamp structure 1351A-1 and 1351B-1 is substantially identical (i.e., formed using the same die mold), and each upper clamp structure 1351A-2 and 1351B-2 is also substantially identical. Each clamp structure defines multiple screw holes that are aligned with corresponding screw holes 1317 formed in PCBA 1310 to facilitate the clamping process. For example, lower clamp structure 1351A-1 includes first screw holes 1357A-1 that are aligned with a corresponding second screw hole 1317 of PCBA 1310 and a corresponding third screw hole 1357A-2 defined through upper clamp structure 1351A-2, which connected by way of an associated screw 1307 during the clamping process.

Assembly of SATA SSD device 1300 is depicted in FIG. 13(A), and the fully assembled device is shown in FIG. 13(B). Connector 1330 is mounted onto an edge of circuit board 1311 that extends between elongated brackets 1351A and 1351B. As with the earlier embodiments, housing 1350 does not include a top cover and a bottom cover, whereby both surfaces 1312 and 1313 of PCBA 1310 are exposed by a corresponding upper opening 1360 and lower opening 1365, which are respectively defined between side rails 1351A and 1351B.

Figure 14A:
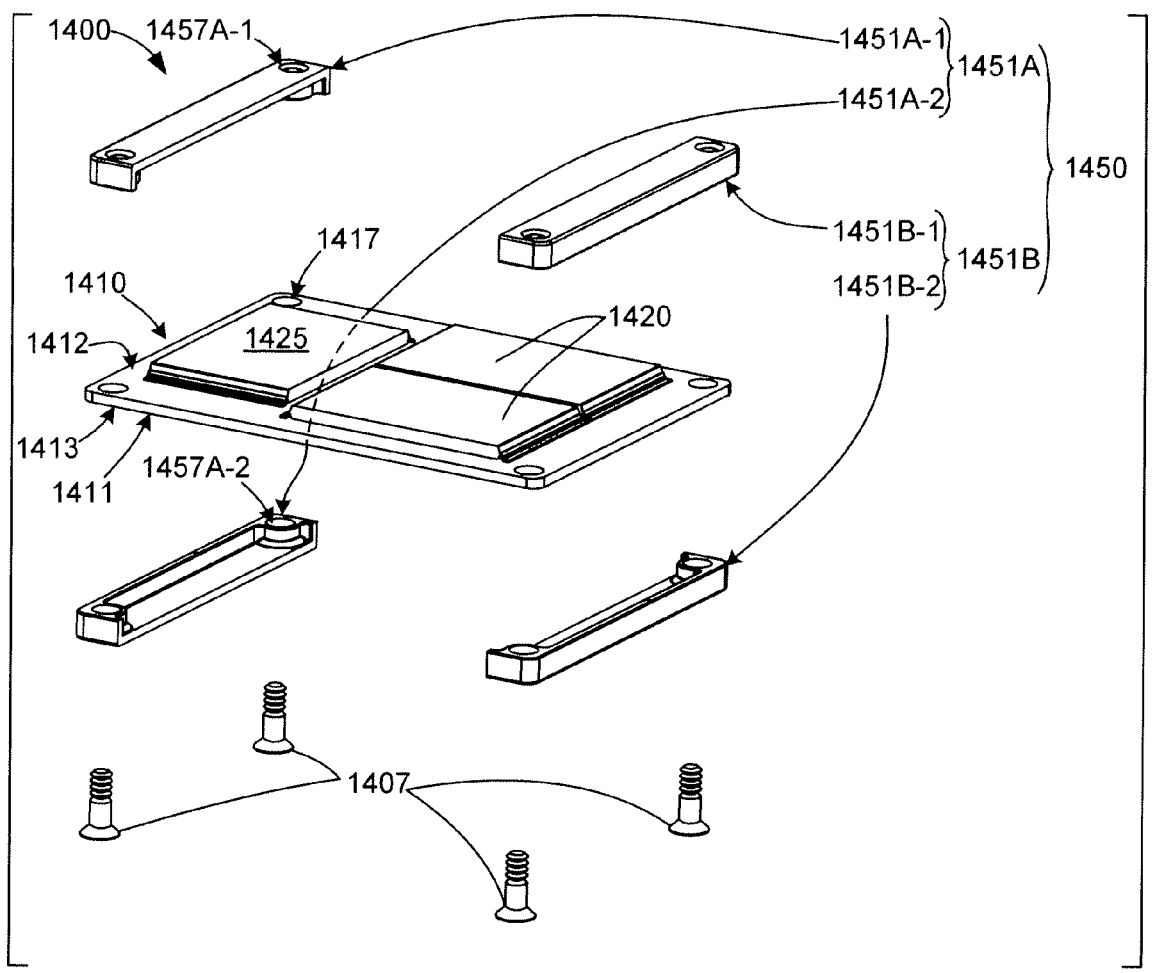
FIGS. 14(A) and 14(B) are exploded perspective and top side perspective views, respectively, showing an 1.0" ZIF SATA-type SSD with a two-part, clamp-type, die-cast metal open-frame type housing according to another embodiment of the present invention.
Figure 14B:
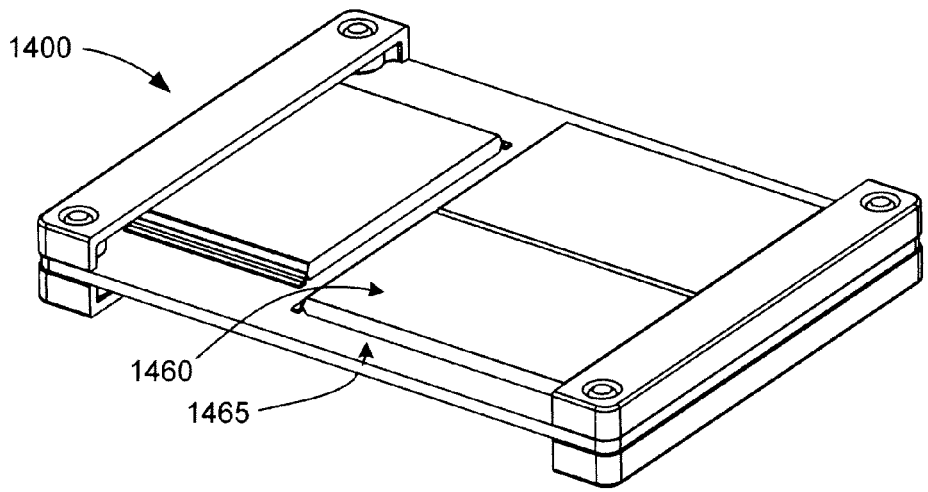

FIGS. 14(A) and 14(B) are exploded perspective and assembled perspective views showing a 1.0" ZIF SATA type SSD device 1400 including a PCBA 1410 having memory chips 1420, a controller chip 1425 and a ZIF SATA type connector (not shown) mounted thereon, and a two-part, open-frame, clamp-type support-type housing 1450 according to an fourteenth specific embodiment of the present invention. PCBA 1410 is similar to PCBA 110 (described above), and includes a circuit board 1411 having opposing upper and lower surfaces 1412 and 1413. Screw holes 1417 are defined through circuit board 1411 at predetermined locations to facilitate connection of printed circuit board 1411 to housing 1450 by way of (first) screws 1407.

Referring to FIG. 14(A), housing 1450 comprises opposing first and second elongated brackets (side rails) 1451A and 1451B, where each bracket includes opposing clamp structures that are clamped to side edges of PCBA 1410 such that elongated brackets 1451A and 1451B are connected solely by PCBA 1410. First elongated bracket 1451A includes a lower clamp structure 1451A-1 and an upper clamp structure 1451A-2, and second elongated bracket 1451B includes a lower clamp structure 1451B-1 and an upper clamp structure 1451B-2. Each lower clamp structure 1451A-1 and 1451B-1 is substantially identical (i.e., formed using the same die mold), and each upper clamp structure 1451A-2 and 1451B-2 is also substantially identical. Each clamp structure defines multiple screw holes that are aligned with corresponding screw holes 1417 formed in PCBA 1410 to facilitate the clamping process. For example, lower clamp structure 1451A-1 includes first screw holes 1457A-1 that are aligned with a corresponding second screw hole 1417 of PCBA 1410 and a corresponding third screw hole 1457A-2 defined through upper clamp structure 1451A-2, which connected by way of an associated screw 1407 during the clamping process.

Assembly of SATA SSD device 1400 is depicted in FIG. 14(A), and the fully assembled device is shown in FIG. 14(B). Connector 1430 is mounted onto an edge of circuit board 1411 that extends between elongated brackets 1451A and 1451B. As with the earlier embodiments, housing 1450 does not include a top cover and a bottom cover, whereby both surfaces 1412 and 1413 of PCBA 1410 are exposed by a corresponding upper opening 1460 and lower opening 1465, which are respectively defined between side rails 1451A and 1451B.

In another alternative to the present invention, each bracket of the two-part housings may be formed using plastic that is molded using known techniques, which further reduces material and manufacturing costs. However, grounding is problematic with plastic-encased SSDs, since there is little or no metal in the plastic case to ground the PCB to. To avoid this problem, as set forth in the embodiments below, the inventors add a case-grounding pin between the plastic bracket and the PCB to sink small ESD currents applied to the plastic case by a user. Although the plastic case is an insulator, some plastics may still conduct small currents. When the SSD device is plugged into a host, the ESD currents applied to the plastic bracket can be shunted through the case-grounding pin to the PCB ground, and then through a connector to the host and the host's chassis ground.

Figure 15A:
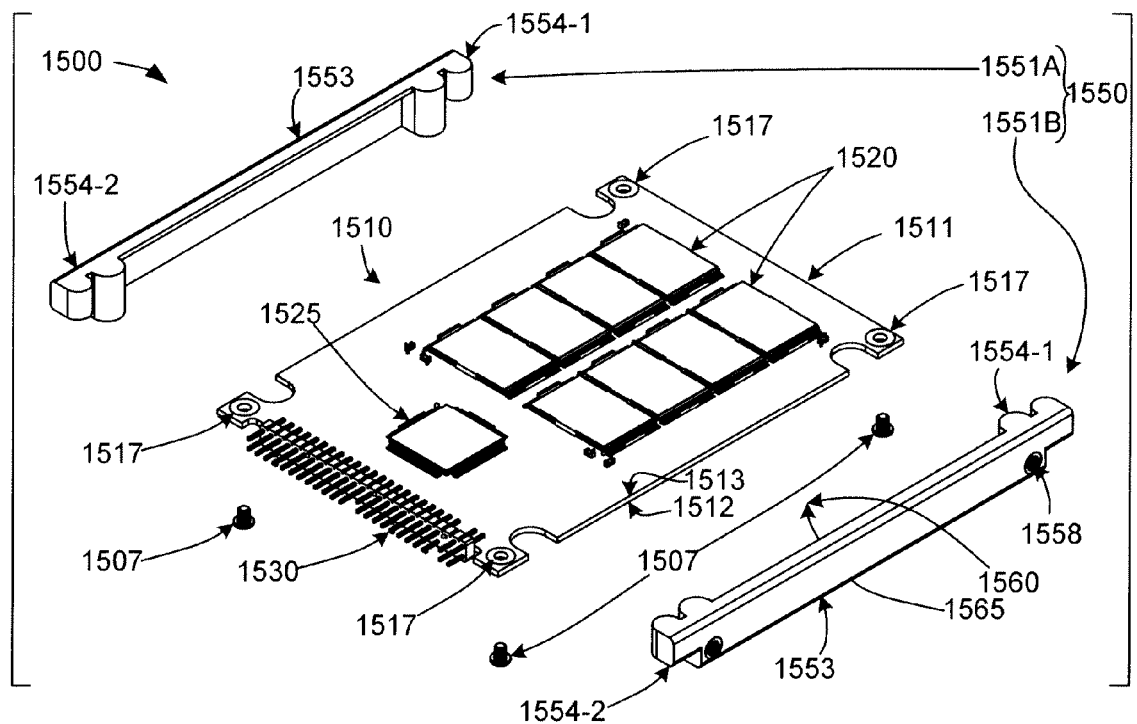
FIGS. 15(A) and 15(B) are exploded perspective and top side perspective views, respectively, showing an 2.5" IDE-type SSD with a two-part, plastic/metal open-frame type housing according to another embodiment of the present invention.
Figure 15B:
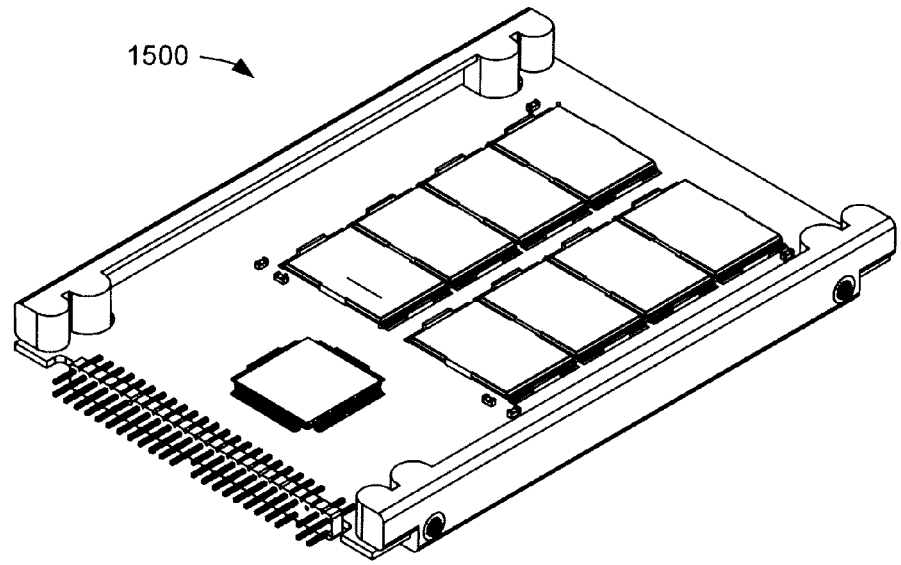

FIGS. 15(A) and 15(B) are exploded perspective and assembled perspective views showing a 2.5" IDE type SSD device 1500 including a PCBA 1510 having memory chips 1520, a controller chip 1525 and an IDE type connector 1530 mounted thereon, and a two-part, plastic/metal, open-frame, support-type housing 1550 according to an fifteenth specific embodiment of the present invention. PCBA 1510 is similar to PCBA 110 (described above), and includes a circuit board 1511 having opposing upper and lower surfaces 1512 and 1513. Screw holes 1517 are defined through circuit board 1511 at predetermined locations to facilitate connection of printed circuit board 1511 to housing 1550 by way of (first) screws 1507. Connector 1530 is an IDE type connector that is electrically connected to controller 1525 in a manner similar to that described above.

Referring to FIG. 15(A), housing 1550 comprises opposing first and second elongated brackets (side rails) 1551A and 1551B that are separately formed and connected to side edges of PCBA 1510 such that brackets 1551A and 1551B are connected solely by PCBA 1510.

Figure 16A:
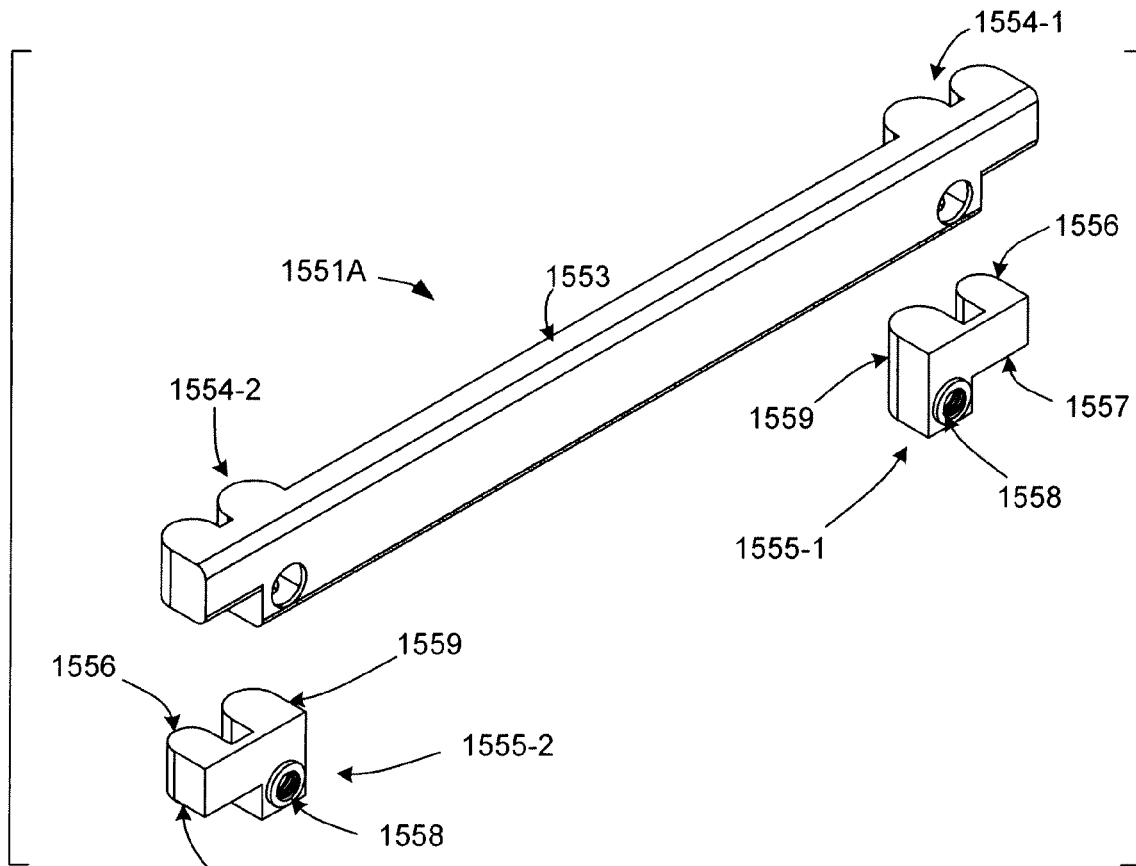
FIGS. 16(A) and 16(B) are exploded perspective and top side perspective views, respectively, showing a bracket of the SSD of FIGS. 15(A) and 15(B) in additional detail.
Figure 16B:
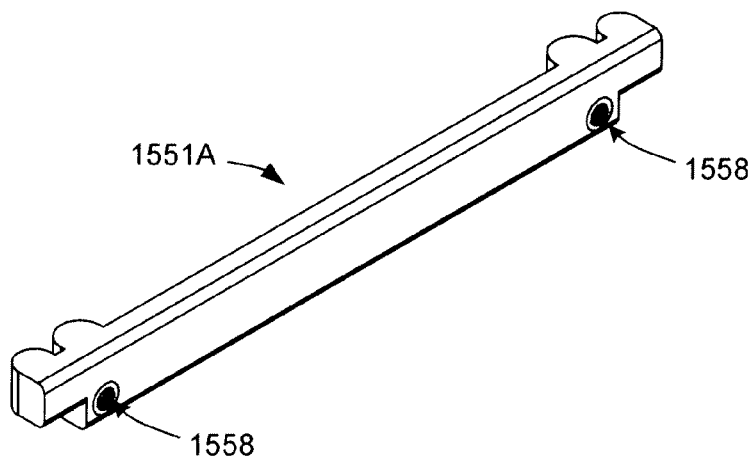

FIGS. 16(A) and 16(B) show bracket 1551A in additional detail (bracket 1551B is substantially identical to bracket 1551A). Bracket 1551A includes a molded elongated plastic structure 1553 including first and second hollow structures 1554-1 and 1554-2 disposed at opposite ends thereof, and first and second case-grounding pins (metal structures) 1555-1 and 1555-2 respectively disposed in first and second hollow structures 1554-1 and 1554-2. Each case-grounding pins (metal structures) 1555-1 and 1555-2 includes a first portion 1556 defining first screw holes 1557 for securing to PCBA 1510 in a manner similar to that described above, and a second portion 1559 defining third screw holes 1558 that are used to connect bracket 1551A to the internal rack frame of a host system in the manner described above with reference to FIG. 1(B). As indicated in FIG. 16(B), third screw holes 1558 are accessed through side openings 1554-1A and 1554-2A defined through corresponding walls of hollow structures 1554-1 and 1554-2.

As indicated in FIG. 16(A), each case-grounding pin 1555-1 and 1555-2 has two axes—a primary axis aligned with screw hole 1558, around which most of the metal for grounding is centered, and a secondary axis aligned with screw hole 1556 that acts as a conducting washer that is screwed to PCBA 1510 to make electrical contact to the PCB ground. The metal around the primary axis (i.e., second portion 1559) acts as additional ground metal, increasing the ground capacitance, and able to sink small ESD currents that might otherwise damage IC's on PCBA 1510. Because the primary axis is offset from the secondary axis, a larger piece of metal is provided for second portion 1559 around the primary axis that is used for first portion 1556 forming the secondary axis, thus increasing the size of the metal ground sink and increasing its effectiveness.

Referring again to FIGS. 15(A) and 15(B), each bracket 1551A and 1551B is attached by way of screws 1507 that extend through screw holes 1517 formed in PCBA 1510 and into corresponding first screw holes 1557 that are disposed below each of hollow structures 1554-1 and 1554-2. The assembly of SATA SSD device 1500 is thus depicted in FIG. 15(A), and the fully assembled device is shown in FIG. 15(B). Connector 1530 is mounted onto an edge of circuit board 1511 that extends between elongated brackets 1551A and 1551B. As with the earlier embodiments, housing 1550 does not include a top cover and a bottom cover, whereby both surfaces 1512 and 1513 of PCBA 1510 are exposed by a corresponding upper opening 1560 and lower opening 1565, which are respectively defined between side rails 1551A and 1551B.

Figure 17A:
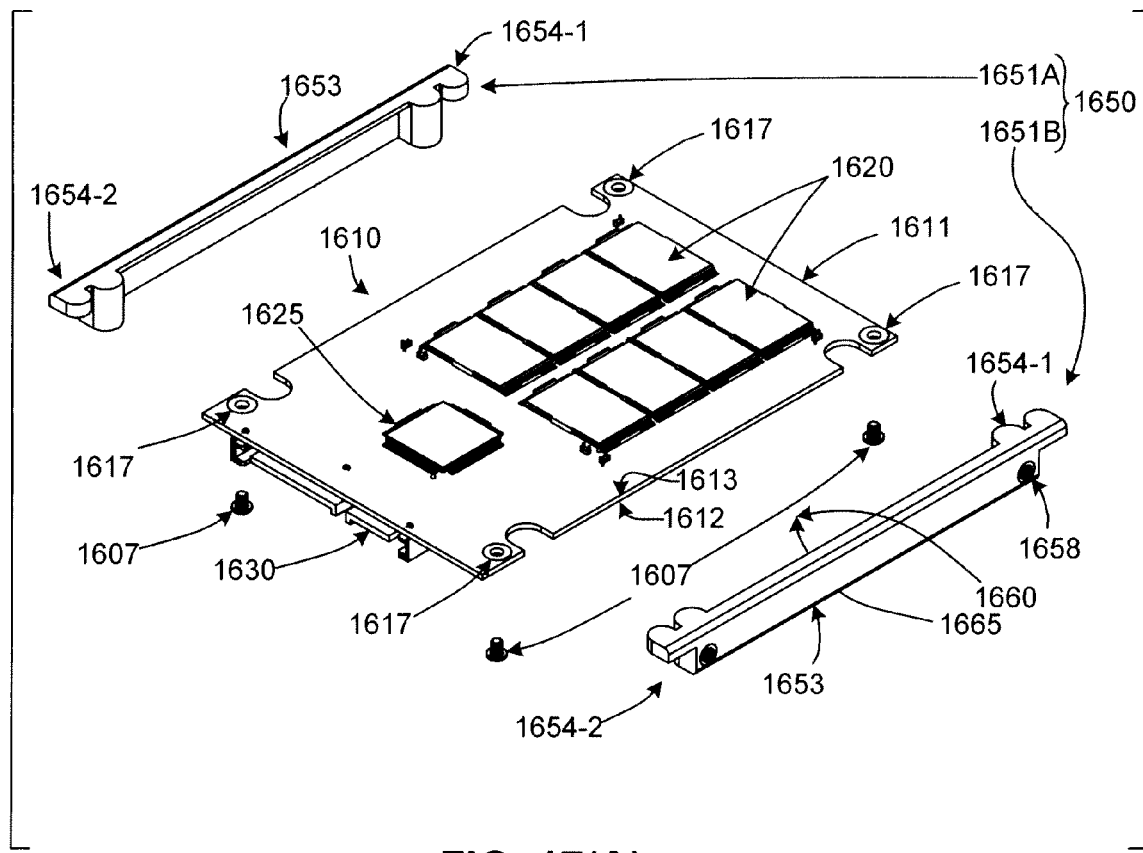
FIGS. 17(A) and 17(B) are exploded perspective and top side perspective views, respectively, showing an 2.5" SATA-type SSD with a two-part, plastic/metal open-frame type housing according to another embodiment of the present invention.
Figure 17B:
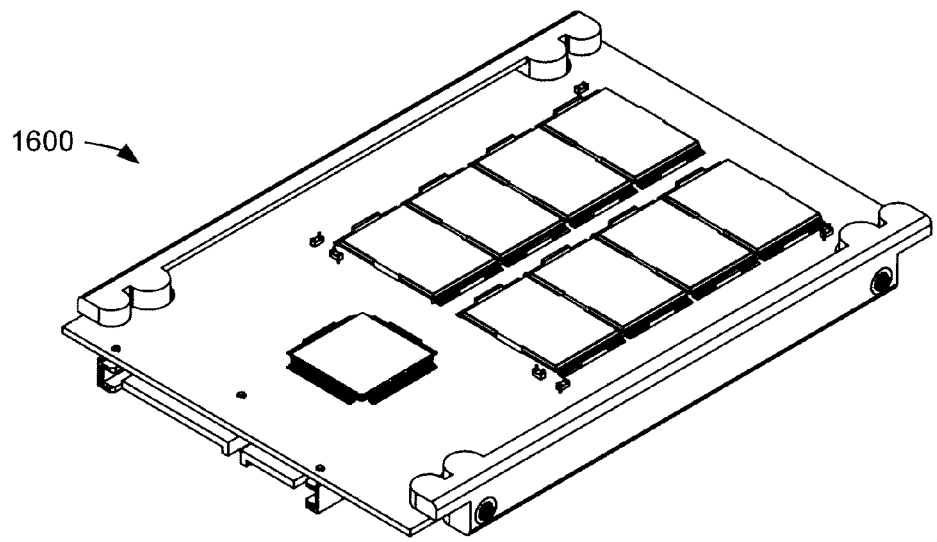

FIGS. 17(A) and 17(B) are exploded perspective and assembled perspective views showing a 2.5" SATA type SSD device 1600 including a PCBA 1610 having memory chips 1620, a controller chip 1625 and an IDE type connector 1630 mounted thereon, and a two-part, plastic/metal, open-frame, support-type housing 1650 according to an sixteenth specific embodiment of the present invention. PCBA 1610 is similar to PCBA 110 (described above), and includes a circuit board 1611 having opposing upper and lower surfaces 1612 and 1613. Screw holes 1617 are defined through circuit board 1611 at predetermined locations to facilitate connection of printed circuit board 1611 to housing 1650 by way of (first) screws 1607. Connector 1630 is a SATA type connector that is electrically connected to controller 1625 in a manner similar to that described above.

Referring to FIG. 17(A), housing 1650 comprises opposing first and second elongated brackets (side rails) 1651A and 1651B that are separately formed and connected to side edges of PCBA 1610 such that brackets 1651A and 1651B are connected solely by PCBA 1610.

Figure 18A:
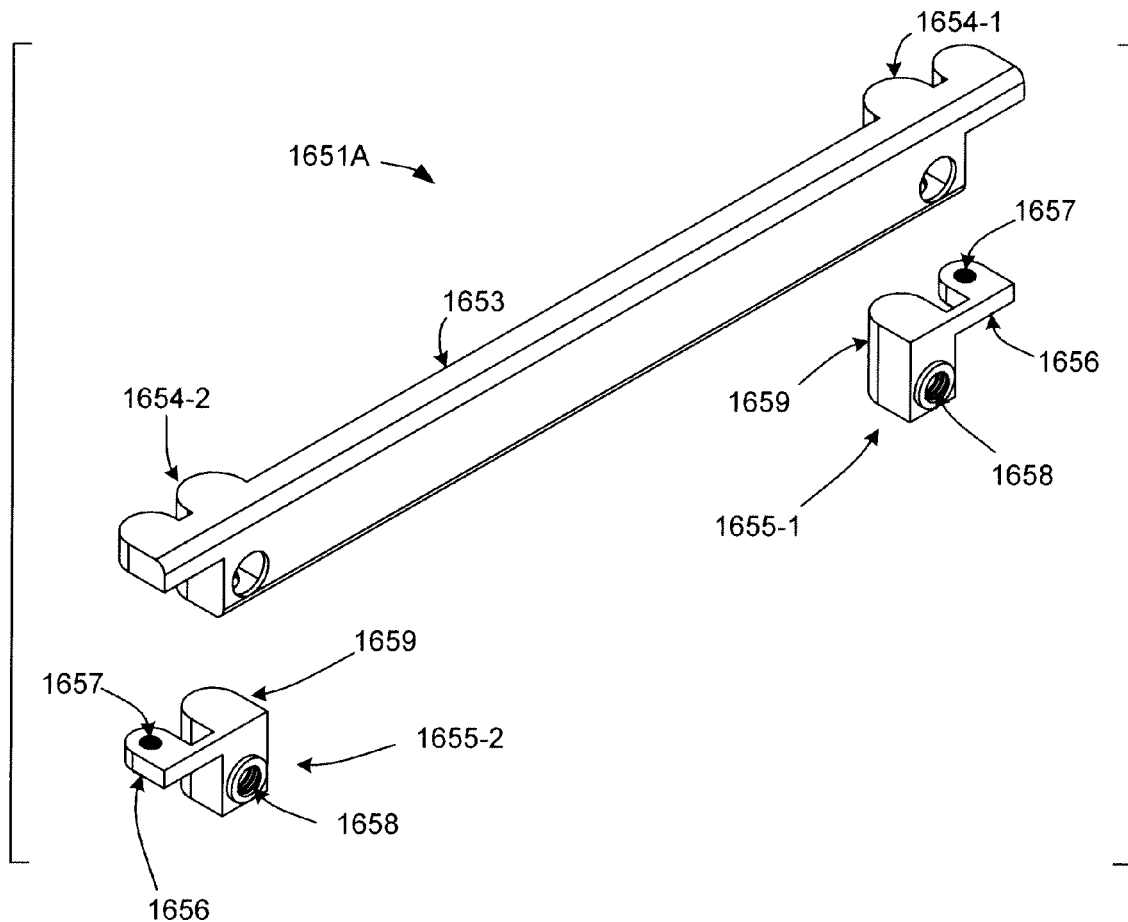
FIGS. 18(A) and 18(B) are exploded perspective and top side perspective views, respectively, showing a bracket of the SSD of FIGS. 17(A) and 17(B) in additional detail.
Figure 18B:
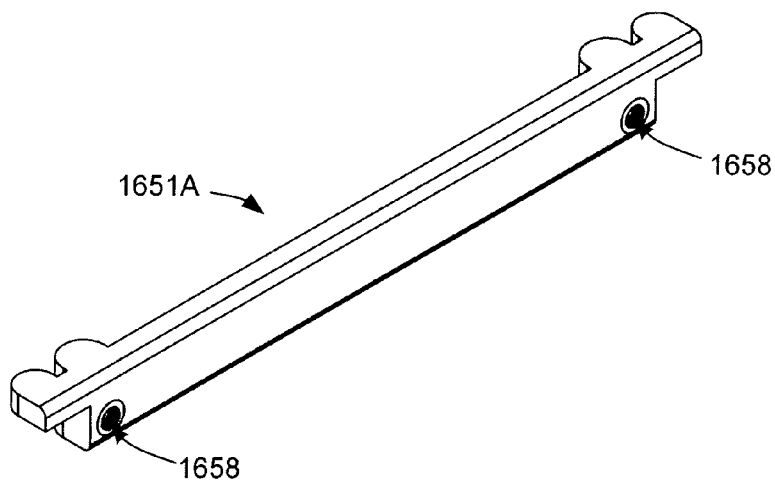

FIGS. 18(A) and 18(B) show bracket 1651A in additional detail (bracket 1651B is substantially identical to bracket 1651A). Bracket 1651A includes a molded elongated plastic structure 1653 including first and second hollow structures 1654-1 and 1654-2 disposed at opposite ends thereof, and first and second case-grounding pins (metal structures) 1655-1 and 1655-2 respectively disposed in first and second hollow structures 1654-1 and 1654-2. Each case-grounding pins (metal structures) 1655-1 and 1655-2 includes a first portion 1656 defining first screw holes 1657 for securing to PCBA 1610 in a manner similar to that described above, and a second portion 1659 defining third screw holes 1658 that are used to connect bracket 1651A to the internal rack frame of a host system in the manner described above with reference to FIG. 1(B). As indicated in FIG. 16(B), third screw holes 1658 are accessed through side openings 1654-1A and 1654-2A defined through corresponding walls of hollow structures 1654-1 and 1654-2.

Referring again to FIGS. 17(A) and 17(B), each bracket 1651A and 1651B is attached by way of screws 1607 that extend through screw holes 1617 formed in PCBA 1610 and into corresponding first screw holes 1657 that are disposed below each of hollow structures 1654-1 and 1654-2. The assembly of SATA SSD device 1600 is thus depicted in FIG. 17(A), and the fully assembled device is shown in FIG. 17(B). Connector 1630 is mounted onto an edge of circuit board 1611 that extends between elongated brackets 1651A and 1651B. As with the earlier embodiments, housing 1650 does not include a top cover and a bottom cover, whereby both surfaces 1612 and 1613 of PCBA 1610 are exposed by a corresponding upper opening 1660 and lower opening 1665, which are respectively defined between side rails 1651A and 1651B.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A solid state drive (SSD) device for providing persistent memory in a host system having an internal rack frame, the SSD device comprising:

a printed-circuit board assembly (PCBA) including a circuit board having opposing first and second surfaces; a plurality of memory chips mounted to at least one of the first and second surfaces of the circuit board; a controller chip mounted to one of the first and second surfaces of the circuit board, the controller chip having a input/output interface circuit for interfacing with the host system, and a processing unit for accessing the plurality of memory chips in response to commands from the host system received by the input/output interface circuit;

a connector mounted on the circuit board for connecting the controller chip to the host system; and an open-frame support-type housing including first and second parallel elongated brackets extending along opposing peripheral edges of said circuit board, each of said first and second brackets including a first connecting structure disposed within said housing for securing said circuit board to said housing, and a second connecting structure disposed on an outside of said housing for connecting to said internal rack frame of said host system, wherein said open-frame support type housing does not include a top cover and a bottom cover, whereby both of said opposing first and second surfaces are exposed by first and second openings, respectively, that extend between said first and second elongated brackets, and wherein the connector is disposed in one of said first and second openings, wherein said first and second parallel elongated brackets comprise substantially identical structures, wherein each said first connecting structure comprises a plurality of screw holes defined in said first and second brackets, wherein said PCBA defines second screw holes, wherein said PCBA is mounted on said support posts of each of said first and second parallel elongated brackets such that each first screw hole is aligned with a corresponding one of said second screw holes, wherein the SSD device further comprises a plurality of first screws, each first screw extending through a corresponding one of said second screw holes and into its corresponding first screw hole, whereby said first and second parallel elongated brackets are connected solely by said PCBA and said first screws, wherein each of said first and second parallel elongated brackets comprises a lower clamp structure and an upper clamp structure, wherein each said first connecting structure comprises said first screw holes defined through said lower clamp structure of each of said first and second parallel elongated brackets, and third screw holes defined through said upper clamp structure of each of said first and second parallel elongated brackets, and wherein each of said first screws extends through an associated third screw hole, through an associated second screw hole, and into an associated first screw hole, whereby said PCBA is clamped between said upper clamp structure and said lower clamp structure of each of said first and second parallel elongated brackets.

2. A solid state drive (SSD) device for providing persistent memory in a host system having an internal rack frame, the SSD device comprising:

a printed-circuit board assembly (PCBA) including a circuit board having opposing first and second surfaces; a plurality of memory chips mounted to at least one of the first and second surfaces of the circuit board; a controller chip mounted to one of the first and second surfaces of the circuit board, the controller chip having a input/output interface circuit for interfacing with the host system, and a processing unit for accessing the plurality of memory chips in response to commands from the host system received by the input/output interface circuit;

a connector mounted on the circuit board for connecting the controller chip to the host system; and an open-frame support-type housing including first and second parallel elongated brackets extending along opposing peripheral edges of said circuit board, each of said first and second brackets including a first connecting structure disposed within said housing for securing said circuit board to said housing, and a second connecting structure disposed on an outside of said housing for connecting to said internal rack frame of said host system, wherein said open-frame support type housing does not include a top cover and a bottom cover, whereby both of said opposing first and second surfaces are exposed by first and second openings, respectively, that extend between said first and second elongated brackets, and wherein the connector is disposed in one of said first and second openings, wherein said first and second parallel elongated brackets comprise substantially identical structures, wherein each said first connecting structure comprises a plurality of screw holes defined in said first and second brackets, wherein said PCBA defines second screw holes, wherein said PCBA is mounted on said support posts of each of said first and second parallel elongated brackets such that each first screw hole is aligned with a corresponding one of said second screw holes, wherein the SSD device further comprises a plurality of first screws, each first screw extending through a corresponding one of said second screw holes and into its corresponding first screw hole, whereby said first and second parallel elongated brackets are connected solely by said PCBA and said first screws, wherein each of said first and second parallel elongated brackets comprises a molded elongated plastic structure including first and second hollow structures disposed at opposite ends thereof, and first and second metal structures, respectively disposed in said first and second hollow structures of each of said first and second parallel elongated brackets, wherein each said first connecting structure comprises said first screw holes defined in a first portion of each of said first and second metal structures of each of said first and second brackets, and wherein each of said second connecting structures comprises a plurality of third screw holes defined in a second portion of each of said first and second metal structures of each of said first and second brackets.

* * * * *